United States Patent
Schneider et al.

(10) Patent No.: US 10,961,826 B2
(45) Date of Patent: Mar. 30, 2021

(54) SUBSURFACE MODELER WORKFLOW AND TOOL

(71) Applicant: ConocoPhillips Company, Houston, TX (US)

(72) Inventors: Curt E. Schneider, Houston, TX (US); James E. Sylte, Seabrook, TX (US); James R. Greer, Spicewood, TX (US); David W. Bunch, Houston, TX (US)

(73) Assignee: ConocoPhillips Company, Houston, TX (US)

( * ) Notice: Subject to any disclaimer, the term of this patent is extended or adjusted under 35 U.S.C. 154(b) by 480 days.

(21) Appl. No.: 15/820,712

(22) Filed: Nov. 22, 2017

(65) Prior Publication Data

US 2018/0171761 A1 Jun. 21, 2018

Related U.S. Application Data

(60) Provisional application No. 62/435,964, filed on Dec. 19, 2016.

(51) Int. Cl.
*E21B 41/00* (2006.01)
*G06F 30/20* (2020.01)
*G06F 30/23* (2020.01)
*E21B 49/00* (2006.01)
*G06F 40/18* (2020.01)
*G06F 40/186* (2020.01)

(52) U.S. Cl.
CPC .......... *E21B 41/0092* (2013.01); *G06F 30/20* (2020.01); *G06F 30/23* (2020.01); *E21B 49/00* (2013.01); *G06F 40/18* (2020.01); *G06F 40/186* (2020.01)

(58) Field of Classification Search
CPC ....... E21B 41/0092; G06F 30/20; G06F 30/23
USPC .............................................. 703/10
See application file for complete search history.

(56) References Cited

U.S. PATENT DOCUMENTS

| | | | |
|---|---|---|---|
| 7,249,009 B2 * | 7/2007 | Ferworn | G01N 33/2823 703/10 |
| 7,512,543 B2 * | 3/2009 | Raghuraman | G01V 11/00 705/7.28 |
| 7,561,997 B1 * | 7/2009 | Miller | G06F 30/20 703/10 |
| 8,577,652 B2 * | 11/2013 | Oh | G06F 40/18 703/6 |
| 2002/0067373 A1 * | 6/2002 | Roe | G06T 17/20 715/762 |

(Continued)

OTHER PUBLICATIONS

Sawyer et al. ("A Simulation-Based Spreadsheet Program for History Matching and Forecasting Shale Gas Production", Society of Petroleum Engineers Inc., 1999, pp. 1-8) (Year: 1999).*

(Continued)

*Primary Examiner* — Iftekhar A Khan

(57) ABSTRACT

A system and method for reducing the complexity of the reservoir simulation process is described. In more detail, an add-in for spreadsheet software program has been developed allowing a user to input minimal amount of information for a simulation, wherein the add-in exports the data as a file readable by any simulation software. Upon completion of the simulation, the add-in will retrieve the results and display them in an easy-to-interpret manner. Thus, the add-in makes the simulation process easier, robust, and user friendly.

21 Claims, 26 Drawing Sheets

(56) References Cited

U.S. PATENT DOCUMENTS

| | | | | |
|---|---|---|---|---|
| 2004/0103376 | A1* | 5/2004 | Pandey | E21B 41/00 715/211 |
| 2005/0096893 | A1* | 5/2005 | Feraille | G06Q 10/04 703/10 |
| 2005/0119911 | A1* | 6/2005 | Ayan | G01V 11/00 703/10 |
| 2006/0025976 | A1* | 2/2006 | Kennon | G06F 30/23 703/10 |
| 2006/0241867 | A1* | 10/2006 | Kuchuk | E21B 49/00 702/13 |
| 2007/0016389 | A1* | 1/2007 | Ozgen | E21B 47/00 703/10 |
| 2008/0040086 | A1* | 2/2008 | Betancourt | E21B 49/00 703/10 |
| 2008/0133194 | A1* | 6/2008 | Klumpen | E21B 49/00 703/10 |
| 2009/0012765 | A1* | 1/2009 | Raphael | E21B 43/16 703/10 |
| 2009/0071239 | A1* | 3/2009 | Rojas | E21B 49/00 73/152.28 |
| 2009/0254325 | A1* | 10/2009 | Gokdemir | H04L 67/12 703/10 |
| 2009/0314490 | A1* | 12/2009 | Prange | E21B 47/00 166/250.09 |
| 2010/0132450 | A1* | 6/2010 | Pomerantz | G01N 33/2823 73/152.28 |
| 2010/0145667 | A1* | 6/2010 | Niu | E21B 49/00 703/5 |
| 2010/0185393 | A1* | 7/2010 | Liang | G01N 15/088 702/7 |
| 2010/0262900 | A1* | 10/2010 | Romatier | G06F 30/20 715/219 |
| 2010/0318337 | A1* | 12/2010 | Bailey | E21B 41/0064 703/10 |
| 2011/0061860 | A1* | 3/2011 | Dean | G01V 99/005 166/250.01 |
| 2011/0238392 | A1* | 9/2011 | Carvallo | E21B 43/00 703/2 |
| 2011/0295581 | A1* | 12/2011 | Montaron | E21B 49/00 703/10 |
| 2012/0232859 | A1* | 9/2012 | Pomerantz | G01V 1/282 703/2 |
| 2014/0067347 | A1* | 3/2014 | Gurpinar | E21B 43/16 703/2 |
| 2014/0163901 | A1* | 6/2014 | Hegazy | G01N 37/00 702/22 |
| 2014/0303949 | A1* | 10/2014 | Boneti | G06F 30/20 703/6 |
| 2015/0161304 | A1* | 6/2015 | Vachon | E21B 43/12 703/10 |
| 2015/0285045 | A1* | 10/2015 | Ziauddin | E21B 43/166 166/305.1 |
| 2016/0216404 | A1* | 7/2016 | Kristensen | E21B 49/10 |
| 2016/0266278 | A1* | 9/2016 | Holderby | G01V 1/288 |
| 2016/0312607 | A1* | 10/2016 | McNealy | E21B 41/0092 |
| 2016/0356125 | A1* | 12/2016 | Bello | E21B 43/14 |
| 2016/0376873 | A1* | 12/2016 | Vachon | E21B 41/0092 703/10 |
| 2017/0337302 | A1* | 11/2017 | Mezghani | G06F 30/17 |
| 2018/0023374 | A1* | 1/2018 | Su | E21B 49/005 703/10 |
| 2018/0148999 | A1* | 5/2018 | Roussel | E21B 47/06 |

OTHER PUBLICATIONS

Sawyer, et al—A simulation-based spreadsheet program for history matching and forecasting shale gas production. SPE-57439, 1999.
International Search Report, PCT/US2017/062999, dated Feb. 12, 2018; 1 pg.

* cited by examiner

FIG. 3A

Model Architecture & Grid (?)

Select Model Type
- ▸ 3D Model
- 3D Model
- 2D Cross Section
- 1D Model
- Single Cell Model

Tank, 1D, and 2D Model Settings

| | |
|---|---|
| Flood Pressure (psia) | 3792 |
| Water Injection Volume (hcpv) | 15 |
| Rate Target (hcpv/yr) | 5% |
| 1D Model Grid Blocks | 300 |
| Tank/1D Volume Multiplier | |

3D Model Area

| | | |
|---|---|---|
| Area (acres) | ▸ acres | 13800 |
| Aspect Ratio (x/y) | | |
| Shape | ▸ <future> | |

Structure & Contacts

Select: ▸ Maureen Field Example
File: C:\apps\SMART\examples\
Structure_Maureen_25x25.depth

| | |
|---|---|
| Top Depth (feet) | 8,000 |
| Deepest Top Depth (feet) | 11,450 |
| Gas-Oil Contact | <future> |
| Oil-Water Contact (feet) | 8702 |

Faults
Select ▸

3D Model Grid Custom Settings

| | |
|---|---|
| Areal Grid Resolution Factor | 0.5 |
| Total Grid Blocks | 1,875 | x-direction

| | |
|---|---|
| blocks (#) | 25 |
| model width (ft) | 24,518 |
| block width (ft) | 980.7 | y-direction

| | |
|---|---|
| blocks (#) | 25 |
| model width (ft) | 24,518 |
| block width (ft) | 980.7 | z-direction

| | | |
|---|---|---|
| multiplier | | |
| blocks (#) | 3 | 3 |

---

Layers & Rock Properties (?)

Select Geologic Modeling Method
- ▸ Layer Cake Model with Avg. Properties
- Layer Cake Model with Avg. Properties
- Properties from Type Log <future>
- Single Facies with Property Ranges
- Multi-Facies with Avg. Properties
- Multi-Facies with Property Ranges

Zones & Layer Properties

| Active Zones | Layer Count (default=1) | Zone Thickness (feet) | Layer Thickness (feet) | Net/Gross Ratio (%) |
|---|---|---|---|---|
| 1 | Yes | 1 | 130 | 130.0 | 62% |
| 2 | Yes | 1 | 98 | 98.0 | 37% |
| 3 | Yes | 1 | 105 | 105.0 | 22% |
| 4 | | | | 0.0 | |
| 5 | | | | 0.0 | |
| 6 | | | | 0.0 | |
| 7 | | | | 0.0 | |
| 8 | | | | 0.0 | |
| 9 | | | | 0.0 | |
| 10 | | | | 0.0 | |

Sensitivity Multiplier(s)
gross(ft): 333    net(ft): 140

Facies & Petrophysical Property Modeling

Select
| Training Image | Facies | NTG(%) | Feature |
|---|---|---|---|
| ▸ Fluvial_2v40w3i2a10 | 2 | 40% | Channel | view
Training Image Advisor

| | | | |
|---|---|---|---|
| Fluvial_3r42w5i3a15 | 3 | 42% | Channel |
| Fluvial_3r41w3i2a10 | 3 | 41% | Channel |
| Fluvial_2r40w5i5a15 | 3 | 40% | Channel |
| | 0 | 135 | |
| | 85424 | 20000 | |

| Facies | Image Proportions | Target Proportions |
|---|---|---|
| Shale | 60% | |
| Channel | 40% | |

Rock Compressibility (1/psi)  3.0E-06
Areal Perm Anisotropy (Kx/Ky)
Type Log  <future>

Water Saturation Method ► Connate by Rel Perm    V=0.98   Dykstra Parsons V-Factor very high vertical heterogeneity
► Effective

| Porosity (%) | Perm. (md) | kv/kh Perm Ratio | Water Connate (%) | Saturation Initial (%) |
|---|---|---|---|---|
| 27% | 525.0 | 0.01 | 29% | |
| 17% | 20.0 | 0.01 | 34% | |
| 10% | 1.0 | 0.01 | 39% | |

21.6%   307.68

(Perm vs P1 P10 P50 P90 P99 chart, Perm (md) 0.1 – 10,000.0, P59, P84.1)

Petrophysical Properties Variogram Settings

| Areal Azimuth (deg.) | 45 | 135 |
|---|---|---|
| Correlation Ranges (feet) | | |
| Areal (Maximum) | 19614 | 10000 |
| Areal (Medium) | 9607 | 5000 |
| Vertical (Minimum) | 67 | 100 |
| Geostatistical Seed | 51173 | 20000 |

Recreate Geomodel

| Porosity (%) | | | Permeability (md) | | | Poro/Perm Correlation | Kv/Kh Ratio | Swc (%) |
|---|---|---|---|---|---|---|---|---|
| Min | Mean | Max | Min | Mean | Max | | | |
| 1% | 3% | 5% | 1 | 5 | 10 | 0.7 | 0.01 | 50% |
| 10% | 20% | 32% | 100 | 500 | 500 | 0.7 | 0.01 | 30% |

FROM FIG. 3A

Type Well Characteristics

| Type | Type 1<br>producer | Type 2<br>water inj | Type 3<br><future> |
|---|---|---|---|
| Start Time (yrs) | | | |
| Completion | | | |
| Type | Perf/Open | Perf/Open | |
| Wellbore Radius (ft) | 0.35 | 0.35 | |
| Hz. Length Target (ft) | | | |
| Hz. Direction | | | |
| Frac Half Length (ft) | | | |
| Skin Factor | | | |
| Max Frac/Skin | 388 ft/-6.37 | 388 ft/-6.37 | |

Type Well Completions

| | Type 1<br>producer | Type 2<br>water inj | Type 3<br><future> |
|---|---|---|---|
| Zone 1 | Yes | Yes | |
| Zone 2 | Yes | Yes | |
| Zone 3 | Yes | Yes | |
| Zone 4 | | | |
| Zone 5 | | | |
| Zone 6 | | | |
| Zone 7 | | | |
| Zone 8 | | | |
| Zone 9 | | | |
| Zone 10 | | | |

Operating Controls & Constraints

| | | | |
|---|---|---|---|
| Max Rate (STbpd) | 12000 | | |
| Shut-In Rate (STbpd) | 10 | | |

| Pressure Control | <future> | FBHP | <future> |
|---|---|---|---|
| Tubing Press (psig) | <future> | | <future> |
| Tubing Inner Diam. (in) | <future> | | <future> |
| Bottom Hole P (psia) | 2000 | 3792 | |
| Max Drawdown(psi) | 200 | | |

FROM FIG. 4A

Coal Bed Methane Evaluation ⑦
SMART Tools - Modeler Prototype

| | |
|---|---|
| Evaluation Title | CBM_Piceance Example |
| Study Type ▸ | Vertical Well, Reservoir Properties By Layer |
| Run Options ▸ | Methane Only (E100, Dual Porosity) |

Simulation Duration (Years) | 10 |

Reservoir & Model Description ⑦

| | | | | | |
|---|---|---|---|---|---|
| Model Area (Acres) | 160 | Model Grid | x-dir | y-dir | z-dir |
| Model Area Aspect Ratio (x/y) | 1 | Width (ft) | 2640 | 2640 | |
| Structure | <future> | grid blocks | 51 | 51 | 2 |
| Structural Dip (degrees) | <future> | block size (ft) | 52 | 52 | |
| | | total active grid blocks | | | 5202 |
| Perm Areal Anisotropy (Kx/Ky) | 1 | Areal Grid Sensitivity Factor | | | 1 |
| Coal Cf (1/psi) | 1.0E-03 | Vertical Grid Sensitivity Factor | | | 1 |
| Sand Cf | 1.0E-05 | | | | |

Properties by Layer

| | | | | Coal Cleat or Sand | | | | |
|---|---|---|---|---|---|---|---|---|
| Layer | Active/Type | Top (feet) | Thickness (feet) | Porosity (fraction) | Sw (fraction) | Perm (md) | NTG (fraction) | Kv/Kh |
| 1 | Coal | 2160 | 25 | 0.05 | 0.99 | 7.0 | 1.00 | 1.00 |
| 2 | | 2180 | 108 | 0.12 | 0.39 | 0.5 | 0.67 | 1.00 |
| 3 | | 2288 | 20 | 0.04 | 0.99 | 5.0 | 0.69 | 1.00 |
| 4 | | 2308 | 13 | 0.04 | 0.90 | 5.0 | 1.00 | 0.00 |
| 5 | | 2321 | 20 | 0.10 | 1.00 | 10.0 | 1.00 | 0.00 |

Uinta and Piceance Basin Typical Values:
For Coal  2000-6000  40-150  0.01-0.03  0.5-1.0  0.01-100  —  —

Well & Completion ⑦

Single-Well Study

| | |
|---|---|
| Water Colm Above Top Coal (m) | 0 |
| Well Name | Prod1 |
| Wellbore Radius, rw (ft) | 0.270 |
| Hydraulic Frac Half Length (ft) | 200 |
| Equivalent Skin Factor | -5.9 |
| Use Constant FBHP? | Yes |
| Bottom Hole Pressure (psia) | 125 |
| Max Allowable Rate (Mscf/d) | |
| Minimum Rate (Mscf/d) | |

Well layer Completions

| | |
|---|---|
| 1 | x |
| 2 | x |
| 3 | x |
| 4 | |
| 5 | | x-dir (feet)

Horizontal/Stacked-Lateral Study

| | |
|---|---|
| Total Length (ft) | 500 |
| Completion Skin | 0 |
| Producing % of Total Length | 100% |
| Perf Vert Segment | Yes |

FROM FIG. 7B

| Run Summary Values | Last Case | Ref Case | Change |
|---|---|---|---|
| Total Gas-in-Place (Bscf) | 2.29 | 0.72 | 1.57 |
| Total Gas Produced (Bscf) | 1.00 | 0.12 | 0.870 |
| Total Gas Recovery Factor (%) | 43% | 17% | 26% |
| Max Gas Rate (Mscfd) | 2,184.63 | 16.44 | 2,168 |
| Methane Gas-in-Place (Bscf) | 2.29 | 0.72 | 1.57 |
| Methane Produced (Bscf) | 0.995 | 0.125 | 0.870 |
| Methane Recovery Factor (%) | 43% | 17% | 26% |
| Max Methane Rate (Mscfd) | 2,185 | 16 | 2,168 |
| CO2 Gas-in-Place (Bscf) | 0.00 | 0.00 | 0.00 |
| CO2 Production (Bscf) | 0.00 | 0.00 | 0.00 |
| CO2 Gas Recovery Factor (%) | 0% | 0% | 0% |
| Max CO2 Rate (Mscfd) | 0 | 0 | 0 |

(plot: Layer Pres. (psia) 0–1000)

Drilling & Completions Advisor ⓘ

| Additional Inputs for "Advisor" Analysis | | Uinta and Piceance Basin Values |
|---|---|---|
| Structural Dip (degrees) | 0-15 | 15 degrees |
| Coal Rank | High-Volatile Bituminous | High- to Low-volatile Bituminous |
| Compressive Strength (psia) | 0-1000 | — |
| Reservoir Pressure Gradient (psi/ft) | >0.2 | < 0.45 psi/ft |
| Vertical distance to strong barrier (ft) | >20 | — |
| Distance to aquifer (ft) | >30 | — |

Recommendation

Well Type & Completion: Vertical Well
-- Cased-hole with single-stage hydraulic frac stimulation
Factors: Single coal seam

Fracturing Fluid Cross-linked gel or water fracture with proppant

Reservoir Conditions & Fluid Properties ⓘ

| Reservoir Pressure (psia) | 935.28 |
|---|---|
| Reservoir Temperature (°F) | 88 |

Gas Properties

| Sep. Gas Gravity (air=1.0) | 0.610 |
|---|---|
| Oil/Gas Ratio (stb/MMscf) | 0 |
| Oil Gravity (deg. API) | 50 |

(plot: Bg (rb/mscf) vs Pressure (psia) 0–1,500)

FROM FIG. 7C

FROM FIG. 7C

Goal Matrix Gas Diffusion
| | |
|---|---|
| Block length (ft) | 1.00 |
| Coal Matrix Shape Factor (1/ft^2) | 12.0 |

Cleat Permeability Enhancement
| | |
|---|---|
| Start (% of Init Pres) | 96.23% |
| Start Pressure (psia) | 900 |
| Increase Exponent | 0.5000 **10-3 |

Methane Characteristics

Critical desorption press, Pc (psia)  900

Pure Methane Langmuir Properties
| | |
|---|---|
| Lang. Vol dry ash-free (scf/ton) | 602 |
| Langmuir Pressure (psia) | 571 |
| Langmuir Vol (scf/ton) | 602 |
| Initial Gas Content, Gci (scf/ton) | 368 |
| Uinta and Piceance Gas Content (scf/ton) | 27-750 |

Goal Matrix Methane Diffusion
| | |
|---|---|
| Diffusion Coefficient (ft^2/d) | 1.00 E-1 |
| Sorption Time (minutes) | 1200 |
| Sorption Time (days) | 0.8 |

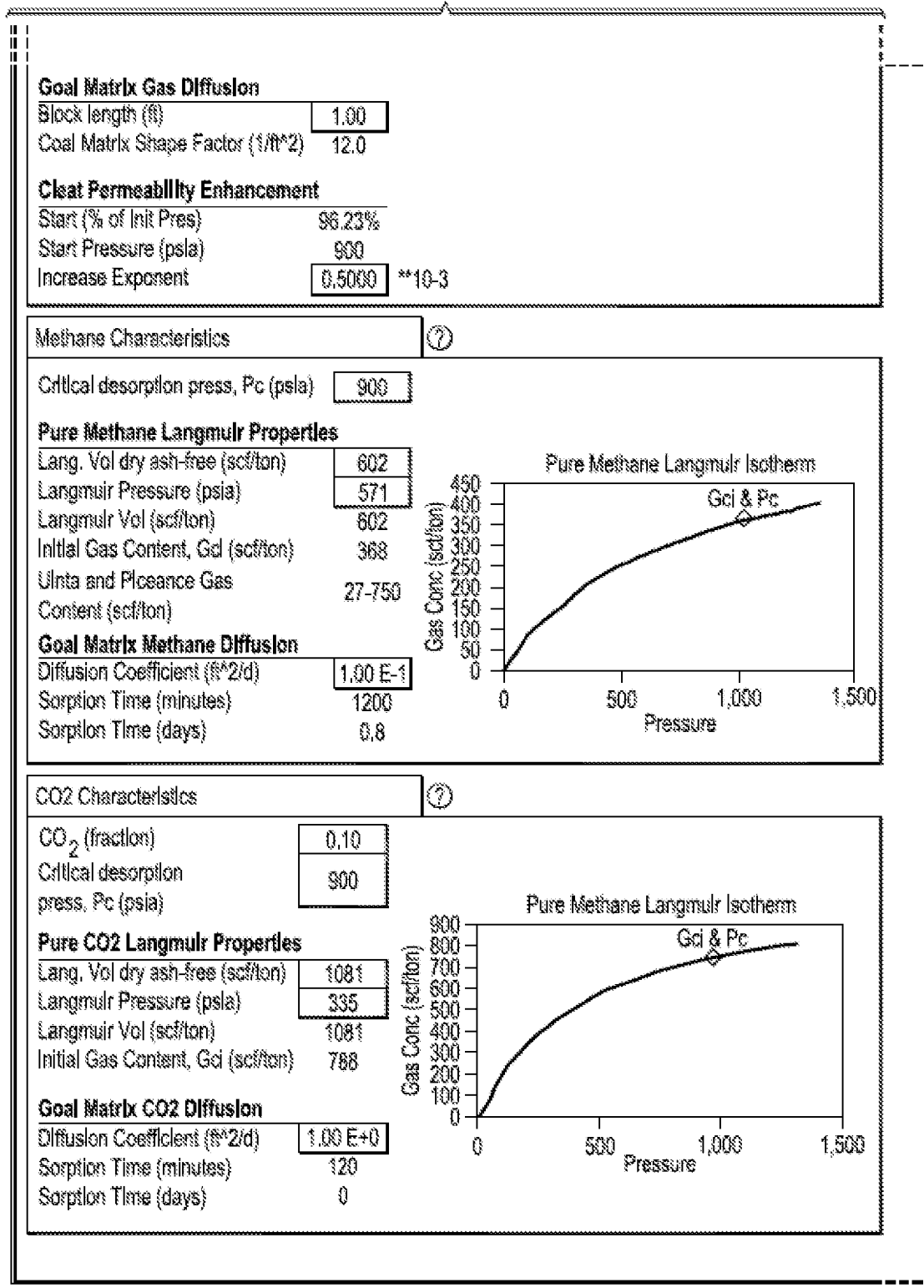

Pure Methane Langmuir Isotherm

CO2 Characteristics
| | |
|---|---|
| $CO_2$ (fraction) | 0.10 |
| Critical desorption press, Pc (psia) | 900 |

Pure CO2 Langmuir Properties
| | |
|---|---|
| Lang. Vol dry ash-free (scf/ton) | 1081 |
| Langmuir Pressure (psia) | 335 |
| Langmuir Vol (scf/ton) | 1081 |
| Initial Gas Content, Gci (scf/ton) | 788 |

Goal Matrix CO2 Diffusion
| | |
|---|---|
| Diffusion Coefficient (ft^2/d) | 1.00 E+0 |
| Sorption Time (minutes) | 120 |
| Sorption Time (days) | 0 |

Pure Methane Langmuir Isotherm

FROM FIG. 7D

| | |
|---|---|
| Res. Gas Gravity (air=1.0) | 0.610 |
| $H_2S$ (fraction) | 0.000 |
| $CO_2$ (fraction)* | 0.100 |
| $N_2$ (fraction) | 0.000 |
| Water Properties | |
| Salinity (ppm TDS) | 20,000 |
| Volume Factor (rb/Stb) | 1.005 |
| Compressibility (1/psi) | 2.95E-06 |
| Viscosity (cp) | 0.81 |

* $CO_2$ (fraction) entered in "CO2 Characteristics" section

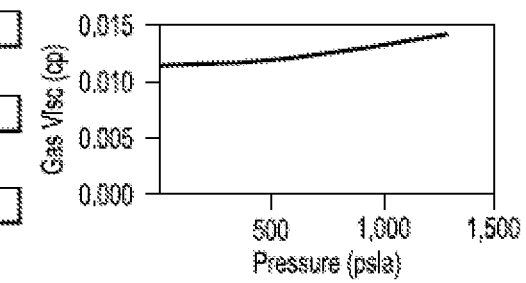

Relative Permeability 

Corey Method

| End Point Saturations | Cleat | Sand |
|---|---|---|
| Critical Water Sat., Swc (frac) | 0.05 | 0.16 |
| Critical Gas Satur., Sgc (frac) | 0.00 | 0.05 |

| End Point Relative Permeability | | |
|---|---|---|
| Krw @ Sw = 1 (fraction) | 1.00 | 0.60 |
| Krg @ Swc (fraction) | 0.70 | 0.80 |

| Corey Exponents | | |
|---|---|---|
| Water, nw | 2.70 | 1.50 |
| Gas, ng | 1.50 | 4.00 |

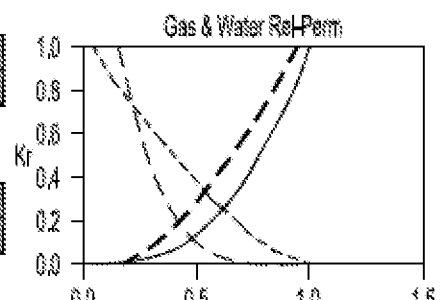

Effective Permeability Thickness (total and all active layers)

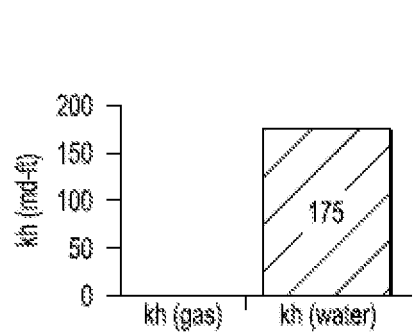
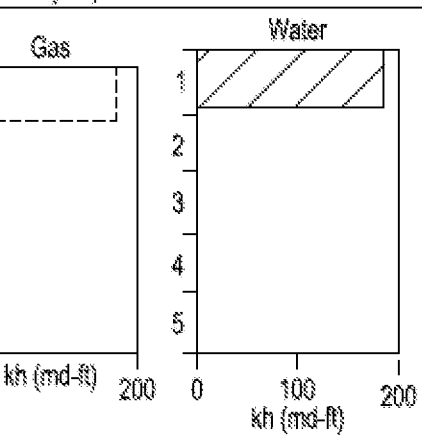

FROM FIG. 7E

FIG. 8A

Layers & Rock Properties

Rock Areal Anisotropy: 1
Rock Compressibility (1/psi): 30e-06

Properties by Layer

| Layer | Active/Type | Thickness (feet) | Porosity (&) | Sw (%) | Perm (md) | NTG (%) | Kv/Kh |
|---|---|---|---|---|---|---|---|
| 1 | x | 10 | 20% | 40% | 1 | 100% | 0.1 |
| 2 |   | 30 | 10% | 40% | 1 | 100% | 0.1 |
| 3 |   | 40 | 10% | 40% | 1 | 100% | 0.1 |
| 4 |   | 40 | 10% | 40% | 1 | 100% | 0.1 |
| 5 |   | 23 | 10% | 40% | 1 | 100% | 0.1 |
| 6 |   | 50 | 10% | 40% | 0.1 | 100% | 0.1 |
| 7 |   | 2 | 10% | 40% | 0.01 | 100% | 0.1 |
| 8 |   | 7 | 10% | 40% | 0.001 | 100% | 0.1 |
| 9 |   | 10 | 10% | 45% | 0.01 | 100% | 0.1 |
| 10 |   | 200 | 10% | 100% | 0.01 | 100% | 0.1 |

Reservoir Development

Single-Well Study

| Well Name | PROD1 |
|---|---|
| Wellbore Radius, rw (ft) | 0.3 |
| Hydraulic Frac Half Length (ft) | 200 |
| Equivalent Skin Factor | -5.61 |

Custom Well Schedule

Range:

Well Constraints

| Bottom Hole P (psia) | 100 |
|---|---|
| Max Allowable Rate (Mscf/d) |   |
| Minimum Rate (Mscf/d) |   |

Horizontal/Stacked-Lateral Study

| Total Length (ft) | 2000 |
|---|---|
| Completion Skin | 0 |
| Producing % of Total Length | 100% |
| Longitudinal Hydraulic Fracture | No |

Single Well Layer Completions

| | |
|---|---|
| 1 | x |
| 2 | x |
| 3 | x |
| 4 | |
| 5 | |
| 6 | x |
| 7 | |
| 8 | |
| 9 | |
| 10 | | x-dir (feet)

Properties by Facies & Geostatistics under construction

Multi-Well Infill Study

| | Well Assumptions | | | | Layer Completions | | |
|---|---|---|---|---|---|---|---|
| | 2-Wells | +2-Wells | +4-Wells | | PROD2 | PROD4 | PROD8 |
| Well Names Prefix | PROD2 | PROD4 | PROD8 | 1 | x | x | x |
| Wellbore Radius (ft) | 0.333 | 0.333 | 0.333 | 2 | | | |
| Frac Half Length (ft) | 0 | 50 | 200 | 3 | | | |
| Equivalent Skin Factor | #NUM! | -4.3 | -5.7 | 4 | | | |
| Bottom Hole P (psia) | 102 | 103 | 108 | 5 | | | |
| Max Rate (Mscf/d) | 5002 | 5003 | 5004 | 6 | | | |
| Min Rate (Mscf/d) | 22 | 23 | 24 | 7 | | | |
| Start Time (yrs) | 0 | 5 | 10 | 8 | | | |
| Field/Facility Rate Limit (Mscf/d) | | | | 9 | | | |

Multi-Well Locations

| | x-dir | y-dir |
|---|---|---|
| PROD2_1 | 15% | 15% |
| PROD2_2 | 85% | 85% |
| PROD4_3 | 65% | 15% |
| PROD4_4 | 35% | 85% |
| PROD8_5 | 35% | 35% |
| PROD8_6 | 85% | 35% |
| PROD8_7 | 15% | 65% |
| PROD8_8 | 65% | 65% | note: %- relative to model boundary

| Rotate 8-Well Pattern | |
|---|---|
| Size (%) | 100% |
| Rotate (degrees) | 0 |
| Center X (%) | 50% |
| Center Y (%) | 50% |

| Rotate 72 Wells | |
|---|---|
| Size (%) | 100% |
| Rotate (degrees) | 0 |
| Center X (%) | 50% |
| Center Y (%) | 50% |

◇ Prod2  □ Prod4  ○ Prod8

| Oil Properties | Gas Properties | Water Properties |
|---|---|---|
| • Gravity to API Conversion<br>• API to Gravity Conversion<br>• Form. Vol Factor (saturated)<br>• From. Vol. Factor (undersat)<br>• Compressibility<br>• Density to Reserv. Conditions<br>• Bubble Point Pressure<br>• Viscosity of Dead Oil<br>• Viscosity of Saturated Oil<br>• Viscosity of Undersat Oil | • Z Factor<br>• Formation Volume Factor<br>• Compressibility<br>• Density<br>• Gravity at Reserv. Conditions<br>• Viscosity<br>• Pseudocritical Pressure<br>• Pseudocritical Temperature<br>• Solubility of Water in Gas | • Formation Volume Factor<br>• Compressibility with No Gas<br>• Density<br>• Compressibility of Gas Sat. Water<br>• Maximum Salinity<br>• Viscosity |

FIG. 9

SUBSURFACE MODELER WORKFLOW AND TOOL

PRIOR RELATED APPLICATIONS

This application is a Non-Provisional application which claims benefit under 35 USC § 119(e) to U.S. Provisional Application Ser. No. 62/435,964 filed Dec. 19, 2016, entitled "SUBSURFACE MODELER WORKFLOW AND TOOL", which is incorporated herein in its entirety for all purposes.

FIELD OF THE DISCLOSURE

The disclosure relates to reservoir simulation, particularly to systems and method for decreasing complexity and computation time.

BACKGROUND OF THE DISCLOSURE

Development and production of hydrocarbon resources (e.g., hydrocarbon reservoirs) used for oil and gas production is a highly capital intensive endeavor. Accordingly, there is enormous economic benefit in optimizing development and management plans for such hydrocarbon resources.

An economic reservoir profitability study is generally based on production profiles determined beforehand. Determination of several oil production profiles, i.e. the evolution of the reservoir production over the course of time, is carried out by selecting several possible scenarios, for example highly likely, likely, and unlikely, related to the uncertain technical parameters of the reservoir and modeling the production based on the selected parameters. Production of a reservoir is defined by the evolution of its fluid production over the course of time. It can be, for example, the evolution with time of the oil and/or gas and/or water production of the reservoir.

Hydrocarbon production and field development scenarios rely heavily on reservoir simulation technology. The economic profitability study is then performed on uncertain economic parameters for each scenario. The scenario method is used so as to limit the number of flow simulations, costly due to calculation time, that are required for the economic profitability study.

The crux of the economic studies is the simulation step. Simulation of a reservoir is difficult because of the amount of data, variables, decision points, and minutia that must be accounted for in a particular model. For example, the development planning process for any particular reservoir often includes defining the optimal type, size, number, location, and timing of surface facilities and/or wells, how and when these facilities and/or wells should be connected, etc. The reservoir management process for any particular reservoir often includes planning optimal type, size, number, location, and timing of infill wells, determining injection and production rates at wells, etc.

The traditional approach to reservoir simulation for most commercial simulation software packages is to separate the workflow physically with a pre-processor program, to assist in building a model in a second program, and view results and interpretation in a post-processor program. Unfortunately, each program is tailored to the specific simulator. Many of these programs (e.g. pre and post processor) are very complex, and often require considerable training and continuous usage to maintain proficiency. Further, these programs are difficult to customize and rarely include all required functionality.

There also exists a class of uncertainty and sensitivity analysis tools designed to operate on simulation input files that require users to parameterize the input assumptions for the model. These systems can be difficult to setup, time-consuming, and can be prone to error.

Thus, there exists a need for a better approach to developing input files for simulators. Ideally, the approach will work with any commercially available simulator, will be easy to use, and will speed the characterization and operational steps for building, running and interpreting reservoir simulation models.

SUMMARY OF THE DISCLOSURE

Described herein is a system for simplifying the construction of reservoir simulation models of varying degrees of complexity and methods of use. Specifically, the system includes a streamlined modeler workflow and tool, programmed into a spreadsheet application, for inputting required details for a simulation model wherein the workflow tool formats the details for a given process simulator software, submits the data file to the simulator software, retrieves simulation results, and displays such results in a user-friendly form for interpretation and visualization. Thus, the workflow tool is built for speeding the characterization and operational steps for building, running, and interpreting reservoir simulation models. Methods of using such system are also described.

The disclosed system is designed to make the process much easier, robust and user friendly, allowing the subsurface professional the opportunity to focus their limited time on important reservoir characterization/development issues, and less time on the mechanics of constructing and debugging a model.

An additional advantage of the present system is its ability to accommodate a variety of simulator software packages. A tool for converting input data to a format readable by a given simulator software is also programed into the spreadsheet. The workflow and tool has been programmed and utilized for subsurface characterization (e.g. geomodeling, scalable gridding, fluid analogs and correlations, classic metrics, etc), development characterization (e.g. types of wells and patterns or orientations, well control, wellbore hydraulics, etc), and uncertainty and value characterization (e.g. decision trees, economics, tornado, framing table and the like).

The workflow and tool functions programmed into the spreadsheet application in the presently disclosed system are exemplified as an Excel-based platform. Excel was chosen because many users are generally familiar with the program, allowing the users to quickly learn and take advantage of the new workflow for simulation. Further, Excel's workbook template feature allows for ease of developing the various model-building templates for many different technical objectives and for inputting data and retrieving simulation results from a variety of simulators. However, the workflow and tool can easily be translated to any other programming language, including Numbers, Quattro Pro, Solaris, Lotus 1-2-3, and the like, for use in another spreadsheet program.

The process simulation software can be any commercially available, open source or in-house program for modeling reservoir development such as PSIM (from ConocoPhillips), Crystal Ball (Oracle), S3Graf (ScienceSoft), Roxar Tempest™ (Emerson), and the like. In fact, many private, open source or commercial software platforms are available for reservoir simulation. The most well known open source packages include:

BOAST—Black Oil Applied Simulation Tool (Boast) simulator is a free software package for reservoir simulation available from the U.S. Department of Energy. Boast is an IMPES numerical simulator (finite-difference implicit pressure-explicit saturation) which finds the pressure distribution for a given time step first then calculates the saturation distribution for the same time step isothermal. The last release was in 1986 but it remains as a good simulator for educational purposes.

MRST—The MATLAB Reservoir Simulation Toolbox (MRST) is developed by SINTEF Applied Mathematics as a MATLAB® toolbox. The toolbox consists of two main parts: a core offering basic functionality and single and two-phase solvers, and a set of add-on modules offering more advanced models, viewers and solvers. MRST is mainly intended as a toolbox for rapid prototyping and demonstration of new simulation methods and modeling concepts on unstructured grids.

OPM—The Open Porous Media (OPM) initiative provides a set of open-source tools centered around the simulation of flow and transport of fluids in porous media.

The best known commercial packages include:

CMG Suite (IMEX, GEM and STARS)—Computer Modelling Group currently offers three simulators: a black oil simulator, called IMEX, a compositional simulator called GEM and a thermal compositional simulator called STARS.

ECLIPSE is an oil and gas reservoir simulator originally developed by ECL (Exploration Consultants Limited) and currently owned by SIS, a division of Schlumberger. The name ECLIPSE originally was an acronym for "ECL's Implicit Program for Simulation Engineering". Simulators include black oil, compositional, thermal finite-volume, and streamline simulation. Add-on options include local grid refinements, coalbed methane, gas field operations, advanced wells, reservoir coupling, and surface networks.

Landmark Nexus—Nexus is an oil and gas reservoir simulator originally developed as 'Falcon' by Amoco, Los Alamos National Laboratory and Cray Research. It is currently owned, developed, marketed and maintained by Landmark Graphics, a product service line of Halliburton.

Stochastic Simulation ResAssure—ResAssure is a stochastic simulation software solution, powered by a robust and extremely fast reservoir simulator. The staggering speed-up is achieved by innovative numerical solutions and advanced mathematical formulations for solving subsurface challenges.

Rock Flow Dynamics tNavigator supports black oil, compositional and thermal compositional simulations for workstations and High Performance Computing clusters. The simulation software is expected to rely a specific type of data file for reservoir input and parameters. The workflow and tool in the spreadsheet will automatically generate this data file format when interfaced with the chosen simulation program.

In one embodiment of the present application is a workflow system programed into a spreadsheet or graphing software for preparing a simulator input file, waiting for a simulation to run, retrieving and displaying the simulation results in an easy to understand format. The workflow system has a plurality of templates, each template having a single technical objective and one or more utilities for guiding a user as to what reservoir parameters are needed and for applying one or more calculations or correlations to obtain additional parameters.

An integration tool is also programmed into the spreadsheet to assist in exporting the modeling information in a format readable by an independent reservoir simulation program and for retrieving simulation results. This integration tool can have a simulation control module, which has a set of machine-readable instructions for managing the flow of data between the workflow and the reservoir simulation system. The simulation control module can be capable of communicating with the spreadsheet application and the reservoir simulation system.

Functions of the simulation control module can include, but are not limited to, conveying input data to the reservoir simulation system, mapping, graphing or otherwise displaying results received from the reservoir simulation system to the corresponding areas of the workbook, triggering the execution of user-defined functions, triggering the execution of functions for the spreadsheet application and/or reservoir simulation system, and the like.

In some embodiments, the integration is a set of instructions programmed into a worksheet as opposed to a specific module or utility.

In another embodiment, the system is an Excel-based add-in tool that has multiple templates for each technical analysis objective, and within each template, are utilities for building a simulator input file and for displaying resulting simulator data, and an integration tool for connecting the add-in tool to a commercially available reservoir simulator.

In yet another embodiment, the system includes a spreadsheet program and a separate and discrete reservoir simulator program, wherein the workflow and tool are pre-programmed alongside an integration tool for connecting the spreadsheet to the reservoir simulator program and allowing the transfer of files and data between the two programs.

In one embodiment of the present application is a method for using a system having a spreadsheet program and a reservoir simulator program, wherein the spreadsheet program includes a workflow having templates for one or more technical analysis objective for simulation. A user selects the technical analysis objective, and, within the template, the user specifies required details of the simulation model such as grid area, model dimensions, layer characterization and the like. Each selection auto-inputs specific parameters of the chosen details. The user can, optionally, customize the required details of the simulation model. Once finished, the details are translated into a format that is readable for any commercially available reservoir simulator processor. The workflow waits for the simulation to end, at which time it retrieves the results and displays them in a meaningful form, such as tables, charts, and/or images for technical interpretation and visualization.

In another embodiment, more than one technical analysis objective is chosen, details are selected for both templates, and the combined simulator file is sent to the simulator processor for simulation. The results of the simulation are displayed in a spreadsheet.

The features of the system include, but are not limited to:

Simplified and Faster Workflow. The system is designed to collapse the workflow steps for both experienced and casual users and create a high level of functionality with a minimum of effort. The traditional pre- and post-processing tools are simplified to one based on Excel or whichever language or software the system is programmed. Excel is preferred as the general familiarity many users have with Excel allows them to quickly learn and take advantage of the new workflow. The system's workflow also includes methods and/or means to link into more complicated commercial pre/post processors to allow ease of transition into that environment if required.

Integration of Techniques. The Modeler's model-building templates include the integration of classical and complementary techniques like analytical methods, certain metrics, and analogue information.

Built-in Scalability. The Modeler's model-building templates allow a wide range of scalability, from very little detail to highly detailed modeling. Utilization of correlations for PVT and relative permeability, as well as logic for grid construction and development scenarios, creates a unique workflow not available in any of the commercial tools. In contrast to known techniques that operate on the simulator input text file by parameterization, the Modeler approach is to include the simulation input file in the Excel workbook. The simulator file is the operated on directly and dynamically through Excel formulas, functions, and procedures. Similar arrangements can be made for other spreadsheet alternatives.

Customization Flexibility. Since the Modeler workflow is based on Excel, it is significantly easier for users to customize the input, modeling building logic, and results analysis to fit their analysis circumstances. Core functions of the tool operations can be protected by an Excel Add-in allowing users to develop their own visual basic custom functions and procedures to add custom functionality without modifying the core system.

Unless specifically stated or otherwise apparent from the following discussion, it is appreciated that throughout the description, discussions utilizing terms such as "processing" or "computing" or "generating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present disclosure also relates to a computing apparatus for performing the operations herein. This apparatus may be specially constructed for the required purposes of modeling, or it may comprise a general-purpose computer selectively activated or reconfigured by a spreadsheet program and reservoir simulation computer program stored in the computer. Such computer programs may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

Hardware may preferably include massively parallel and distributed Linux clusters, which utilize both CPU and GPU architectures. Alternatively, the hardware may use a LINUX OS, XML universal interface run with supercomputing facilities provided by Linux Networx, including the next-generation Clusterworx Advanced cluster management system.

Another system is the Microsoft Windows 7 Enterprise or Ultimate Edition (64-bit, SP1) with Dual quad-core or hex-core processor, 64 GB RAM memory with Fast rotational speed hard disk (10,000-15,000 rpm) or solid state drive (300 GB) with NVIDIA Quadro K5000 graphics card and multiple high resolution monitors.

Slower systems could be used but are less preferred since simulations are computation intensive.

In one embodiment, the computer system or apparatus may include graphical user interface (GUI) components such as a graphics display and a keyboard, which can include a pointing device (e.g., a mouse, trackball, or the like, not shown) to enable interactive operation. The GUI components may be used both to display data and processed data and to allow the user to select among options for implementing aspects of the method or for adding information about reservoir inputs or parameters to the computer programs. The computer system may store the results of the system and methods described above on disk storage, for later use and further interpretation and analysis. Additionally, the computer system may include on or more processors for running said spreadsheet and simulation programs.

In another embodiment, the workflow system can be programmed to display the results of the simulation on screen or to allow automatic exportation into a presentation software such as PowerPoint.

In yet another embodiment, the workflow system is used to simulate a reservoir production and optimize production levels by varying the input parameters. The optimized plan is then implemented in the field, by e.g., well placement, length, well array pattern, completion methods, production methods such as cyclic steam injection or steam assisted gravity drainage methods, in situ combustion methods, solvent based methods, combinations thereof, injection rates, and the like.

This summary is provided to introduce a selection of concepts that are further described below in the detailed description. This summary is not intended to identify key or essential features of the claimed subject matter, nor is it intended to be used as an aid in limiting the scope of the claimed subject matter.

The term "many-core" as used herein denotes a computer architectural design whose cores include CPUs and GPUs. Generally, the term "cores" has been applied to measure how many CPUs are on a giving computer chip. However, graphic cores are now being used to offset the work of CPUs. Essentially, many-core processors use both computer and graphic processing units as cores.

As used herein, "scalability" refers to the ability to move within the spatial scale of the reservoir model from e.g. lab, pore, core and field scales.

As used herein, "workflow" refers to the series of activities that are necessary to complete a simulation and includes sub-activities.

As used herein, "templates" or "themes" refer to the arrangement of model building logic that is needed to successfully model a specific technical analysis such as waterflood simulation, coal bed simulation, and the like.

As used herein, "modeler library" refers to a collection of templates or themes stored in the disclosed toolkit. The modeler library allows a user to quickly move between the templates for projects requiring more than one technical analysis.

As used herein, "utilities" refers to the inputs, parameters and/or applications that are needed to form a readable simulator input file for running and building the model for a given template or theme.

As used herein, "technical analysis objective" refers to the type of reservoir characterization and development being simulated.

As used herein, "workbook" refers to a spreadsheet file that contains two or more spreadsheets and can be use to organized related information.

As used herein, "SMART" (Scalable, Multidiscipline, Applied, Reservoir, Technology) refers to an exemplary Excel toolkit used in the tests described below.

The use of the word "a" or "an" when used in conjunction with the term "comprising" in the claims or the specification means one or more than one, unless the context dictates otherwise.

The term "about" means the stated value plus or minus the margin of error of measurement or plus or minus 10% if no method of measurement is indicated.

The use of the term "or" in the claims is used to mean "and/or" unless explicitly indicated to refer to alternatives only or if the alternatives are mutually exclusive.

The terms "comprise", "have", "include" and "contain" (and their variants) are open-ended linking verbs and allow the addition of other elements when used in a claim.

The phrase "consisting of" is closed, and excludes all additional elements.

The phrase "consisting essentially of" excludes additional material elements, but allows the inclusions of non-material elements that do not substantially change the nature of the invention.

The following abbreviations are used herein:

| ABBREVIATION | TERM |
| --- | --- |
| PVT | Pressure, volume, temperature |
| TAO | Technical analysis objective |
| VB | Visual Basic |
| GUI | Graphical user interface |
| EOS | Equation-of-State |

BRIEF DESCRIPTION OF THE DRAWINGS

FIG. 3A-B. An interface for an Oil Reservoir Waterflood simulation using one embodiment of the present system showing input screens for "Model Architecture and Grid" and "Layers and Rock Properties".

FIG. 4A-B. An interface for an Oil Reservoir Waterflood simulation using the SMART modeler showing input screens for "Reservoir Development Options".

FIG. 7A-F. An interface for a coalbed methane simulation using the SMART modeler.

FIG. 8A-D. An interface for a tight gas simulation using the SMART modeler.

FIG. 9. List of fluid property correlation functions that have been successfully incorporated into the SMART Modeler.

DESCRIPTION OF EMBODIMENTS OF THE DISCLOSURE

Figure 1A:
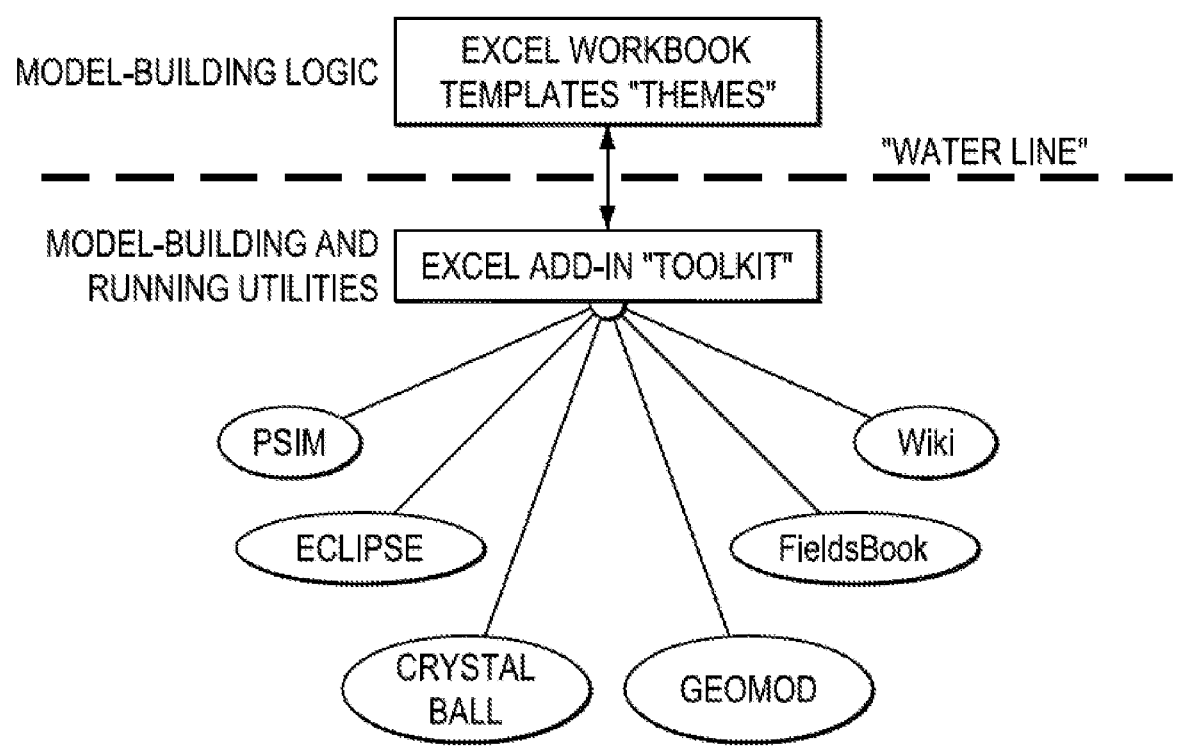
FIG. 1A. Architecture of one embodiment of the presently disclosed system.

The disclosure provides a novel system and method of use for speeding the characterization and operational steps for building, running, and interpreting reservoir simulation models. Core scale to field scale simulations can be produced in a few minutes with minimum input from a user.

The present system and methods includes any of the following embodiments in any combination(s) of one or more thereof:

A system for simulating a hydrocarbon-containing reservoir, comprising:
a) a computer having one or more processors and a display;
b) a spreadsheet application on said one or more processors, said spreadsheet application having:
 i) a modeler library, wherein said modeler library contains one or more templates, wherein each template has a different technical analysis objective;
 ii) a toolkit within each template having at least one utility, wherein said utility has one or more cells for entering a plurality of reservoir inputs and parameters;
 iii) a converter, wherein said converter transforms said reservoir inputs and parameters into a simulation data file, wherein said simulation data file has a format readable by a reservoir simulator program;
 iv) a worksheet for displaying simulation results on said display; and
c) a reservoir simulator program for simulating reservoir development using at least one of said simulation data file.

A simulation system comprising:
a) a computer having at least one processor and a storage medium, wherein said processor is configured to execute a computer program suite, said computer program suite being stored upon said storage medium, said computer program suite comprising a spreadsheet application and a reservoir simulation application, wherein the spreadsheet application and the reservoir simulation application are discrete, stand alone applications;
b) said spreadsheet application comprising a graphic user interface (GUI) for interacting with users, said graphical user interface comprising a plurality of templates, wherein each template has one or more utilities having a plurality of cells for inputting values for predetermined reservoir inputs and parameters, and wherein said graphical user interface further comprises an integration tool for transforming said inputted values into at least one data sheet that is readable by said reservoir simulation application, retrieving simulation results from said reservoir simulation application and displaying said results in a worksheet; and, said reservoir simulation application comprising a computer program for simulating reservoir development using said at least one data sheet.

A method of modeling an oil reservoir comprising,
a) entering one or more reservoir inputs and parameters into a programmable spreadsheet workbook, said spreadsheet workbook having:

i) a modeler library, on said one or more processor, wherein said library contains one or more templates, wherein each template has a different technical analysis objective;

ii) a toolkit within each template having at least one utility, wherein said utility has one or more spaces for entering reservoir inputs and parameters;

iii) a converter, wherein said converter transforms said reservoir inputs and parameters into a simulation data file, wherein said simulation data file has a format readable by a reservoir simulator program;

iv) an integration tool for connecting said spreadsheet workbook with said reservoir simulation program; and v) a worksheet for displaying simulation results on said display;

b) converting reservoir inputs and parameters into a simulation data file with said converter;

c) submitting said simulation data file to said reservoir simulator program with said integration tool;

d) simulating a reservoir development to create a simulation result;

e) retrieving said simulation results with said integration tool; and displaying said simulation results in said worksheet.

A method of modeling an oil reservoir waterflood comprising, a) entering one or more reservoir characteristics, reservoir development configuration, fluid injection properties and model parameters into a programmable spreadsheet workbook, said spreadsheet workbook having:

i) a modeler library, on said one or more processor, wherein said library contains one or more templates, wherein each template has a different technical analysis objective;

ii) a toolkit within each template having at least one utility, wherein each utility has one or more spaces for entering reservoir inputs and parameters;

iii) a converter, wherein said converter transforms said reservoir inputs and parameters into a simulation data file, wherein said simulation data file has a format readable by a reservoir simulator program;

iv) an integration tool for connecting said spreadsheet workbook with said reservoir simulation program; and v) a worksheet for displaying simulation results on said display;

b) extrapolating injection information from the entered data using one or more utilities to form a raw data spreadsheet;

c) converting said raw data spreadsheet into a simulation data file with said converter;

d) submitting said simulation data file to said reservoir simulator program with said integration tool;

e) simulating a reservoir waterflood to create a simulation result;

f) retrieving said simulation results with said integration tool; and displaying said simulation results in said worksheet.

A method of producing oil from a reservoir comprising, a) entering one or more reservoir inputs and parameters into a programmable spreadsheet workbook, said spreadsheet workbook having:

i) a modeler library, on said one or more processor, wherein said library contains one or more templates, wherein each template has a different technical analysis objective;

ii) a toolkit within each template having at least one utility, wherein said utility has one or more spaces for entering reservoir inputs and parameters;

iii) a converter, wherein said converter transforms said reservoir inputs and parameters into a simulation data file, wherein said simulation data file has a format readable by a reservoir simulator program;

iv) an integration tool for connecting said spreadsheet workbook with said reservoir simulation program; and v) a worksheet for displaying simulation results on said display;

b) converting reservoir inputs and parameters into a simulation data file with said converter;

c) submitting said simulation data file to said reservoir simulator program with said integration tool;

d) simulating a reservoir development to create a simulation result;

e) retrieving said simulation results with said integration tool; and f) displaying said simulation results in said worksheet;

g) repeating one or more of the above steps to optimize said simulation results, and implementing said optimized simulation results in a reservoir to produce hydrocarbon.

Any method or system described herein, wherein said reservoir simulator program is PSIM or Eclipse.

Any method or system described herein, wherein said spreadsheet application is Excel.

Any method or system described herein, wherein said technical analysis objective is waterflooding, tight gas, coalbed methane, slimtube, advanced grids, carbon dioxide flooding, carbon dioxide sequestration, well test design, production forecast roll-up, and/or exploration and field development simulations.

Any method or system described herein, wherein said reservoir inputs and parameters include grid area, model dimensions, PVT, relative permeability, porosity, layer characterization, geomodeling, and/or development options.

Any method or system described herein, wherein said integration tool further comprises a simulation control module and a programming interface, wherein the simulation control module interfaces with the spreadsheet application, and wherein the programming interface interfaces with the reservoir simulation application, wherein all data conveyed between the spreadsheet application is conveyed between the spreadsheet application and the simulation control module, between the simulation control module and the programming interface, and the programming interface and the reservoir simulation application.

Any method or system described herein, wherein said simulation results are displayed as a mixture of charts and tables.

Any method or system described herein, wherein said charts include oil rate, water injection rate, average reservoir pressure, watercut, and/or gas-oil ratio.

Any method or system described herein, wherein simulation results are used to make choices about oilfield development and said choices are implemented in an oilfield to produce oil.

Any method or system described herein wherein reservoir inputs and parameters and simulation results are stored in a non-transitory computer readable medium.

A non-transitory computer readable medium storing any programmable spreadsheet workbook described herein.

The construction of a reservoir simulation model can be a difficult and time-consuming process. Even experienced reservoir simulation users can struggle with the construction of models, and this is even more difficult for new or casual users. Many of these programs are complex and require considerable training and continuous use to maintain proficiency. Generally, a user must be trained to use the simulation processor and any pre-processor or post-processor software. Further, each aspect of the simulation, including mechanism, metrics, data input, and the like, has to uploaded into the processor and re-checked should the simulation results have errors. Because there is rarely any carry over between different software programs and multiple programs may be needed to include all required functionality, much time and effort is needed to lay the foundation for a successful reservoir simulation.

An Excel based program for history matching and forecasting gas production has previously been described in SPE-57439. In SPE-57439, a user enters observed gas and water production data in a worksheet, which are compared with results of multiple simulation runs with different combination of parameters to find the simulation that best matches the historical data of actual production. Though still time-consuming, the program described in SPE-57439 greatly reduced the amount of time needed to history match data.

Guided by this concept of using Excel spreadsheets programs for reservoir studies, the present inventors developed a workflow and tool system in a spreadsheet workbook for improving the entire simulation process. The present system is designed to reduce the complexity and time requirements for generating a reservoir simulation and lower the barriers to start a simulation. Further, the described workflow and tool renders the simulation process much easier, robust and user friendly, allowing the subsurface professional the opportunity to focus their limited time on important reservoir characterization/development issues, and less time on the mechanics of constructing and debugging a model.

The present system is exemplified with respect to an Excel-based platform denoted the SMART modeler. However, this is exemplary only, and the workflow can easily be transformed to work with a variety of spreadsheet programs. The following description and examples are intended to be illustrative only, and not unduly limit the scope of the appended claims.

One embodiment of the present system has been structured around an Excel-based platform. The architectural concept for the spreadsheet is displayed in FIG. 1. Here, the model-building logic in encompassed in Excel templates or themes that are located within an Excel Workbook. Each template is directed to a specific technical analysis objective (TAO) that is common to reservoir characterization and development. Examples of TAOs include, but are not limited to oil/waterflooding, tight gas, coalbed methane, slimtube, advanced grids (e.g. those in horizontal fracturing wells), carbon dioxide flooding, carbon dioxide sequestration, and well test design simulations as well as production forecast roll-up, exploration and field development. The templates are collected and stored in a "Modeler Library" which allows for quickly moving between templates and easy sharing with another user or computer.

The benefit of using Excel is the ease of creating new templates using the visual basic programming language. A user can either program a whole new template for the library, or modify an existing template and save it as a new template.

Within each template is a "toolkit" that includes utilities for building and running the model, add-ins or integration tools for improving model-simulator communications, visual basics objects for inputting and displaying the model's identifying information. These features can be shared across the templates; however, it is expected that each template will have at least one feature unique to its objective. Each utility is located in its own worksheet within the Excel Workbook. However, the results, intermediate calculations, and the like can be displayed in separate worksheets in the Workbook.

The core utilities display and store options and field parameters needed for the simulation. Functions, correlations, and visual basic procedures in Excel allow the user, with a minimum of effort, to specify required details of the simulation model including, but not limited to, grid area, model dimensions, PVT, relative permeability, layer characterization, geomodeling, development options, etc. The display for the core utilities can be programed to guide a user from one input point to another. This is important for new or inexperienced simulation users.

Every template has at least one utility that allows for customization of input data, model parameters and/or visual basic procedures for the simulation results for a given template. This allows for customization of a simulation without modifications to the core utilities. In general, the utilities require input such as model architecture, model grid, layers & rock properties, reservoir conditions, fluid properties, relative permeability, capillary pressure, and well development choices.

Within each utility of the characterization, minimum input data is required because many of the core utilities already have basic reservoir parameters pre-programmed into the utility. Further, appropriate correlations are used to complete the characterization, which will be converted to full model input tables for submission to the simulator.

In addition to the main input utilities, other utility worksheets are included in each TAO for performing intermediate calculations, converting and submitting the simulation input file, retrieving results from the simulator, a reference case, and/or table worksheet for tabular data.

In addition to the utilities, each toolkit can have Excel add-ins. These add-in functions include, but are not limited to, Simulation Run & Read Results, 3D View, CSIM/CVIEW Results, Fluid Properties, Top Structure Shape, File Functions, Geomodeling, Save Model Inputs, Pseudo EOS, Model Area Shape, Lift Curves, Depositional Type Models, Development, and/or Faults. These add-ins orchestrate common functions, including procedures and functions for running the model with the simulator and can be shared across the templates.

Figure 1B:
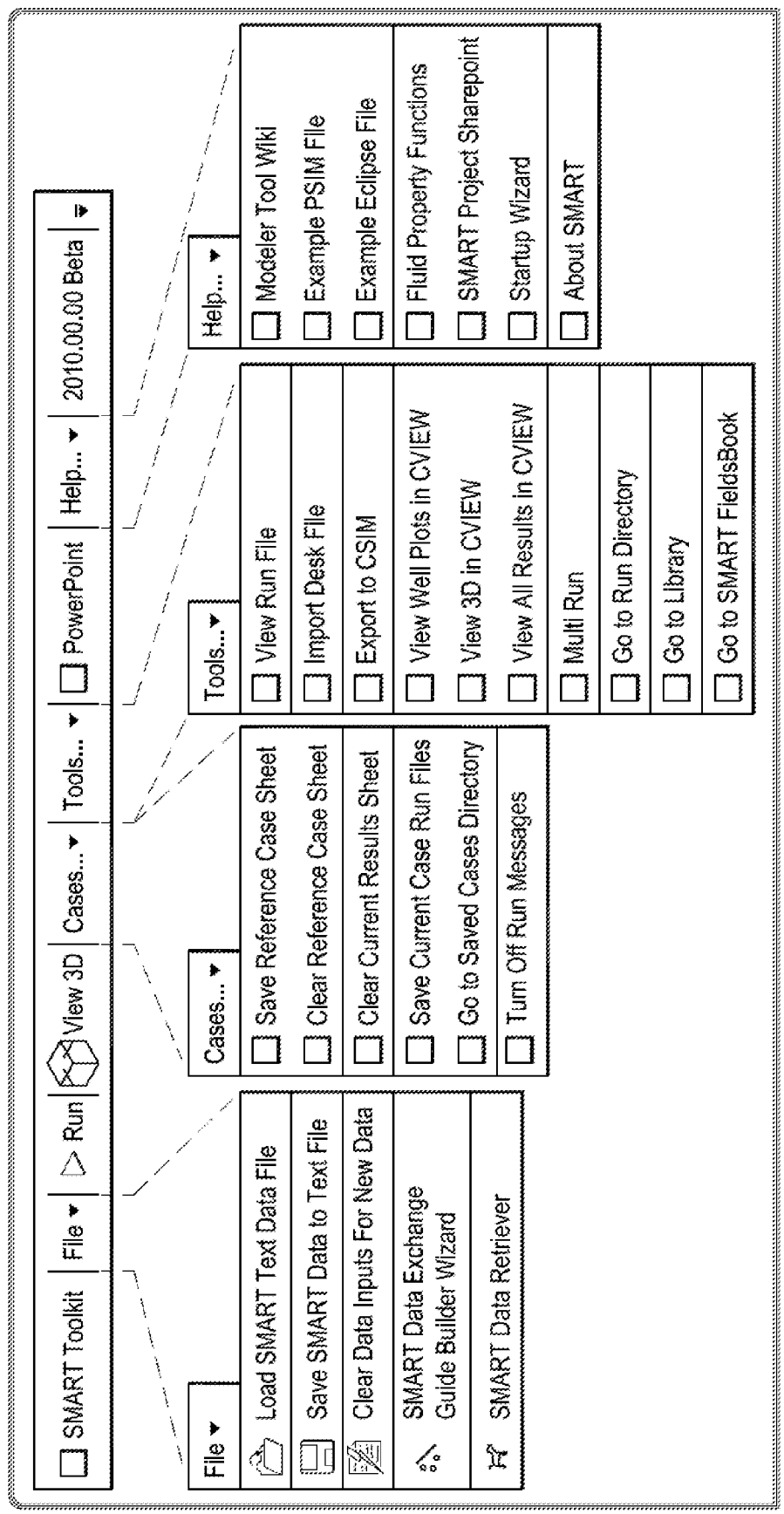
FIG. 1B. Toolbar for one embodiment of the presently disclosed system.

FIG. 1B displays a screenshot of the toolbar for the toolkit that shows some of the functions and add-ins that are commonly shared among different worksheets. If functions are not available for the model, they will be inactive (appearing "greyed out").

The toolkit also has visual basic objects that can be programmed to identify the project and/or parameters of the model. In some embodiments, this is a toolbar displayed at the top of the software window during all phases of the simulation. The toolbar can include information such as project name, reservoir location, simulation run and end times, total simulation time, number of simulations and/or the status of a simulation. (see e.g. FIG. 6A) Other parameters of the simulation, such as years, report intervals, type of model, geological properties and the like can also be included. In other embodiments, the objects will also display links to workflow specific documents such as a quick-start guide, modeler tool concept video, template library, and/or a project sharepoint site in Microsoft's SharePoint software.

Figure 1C:
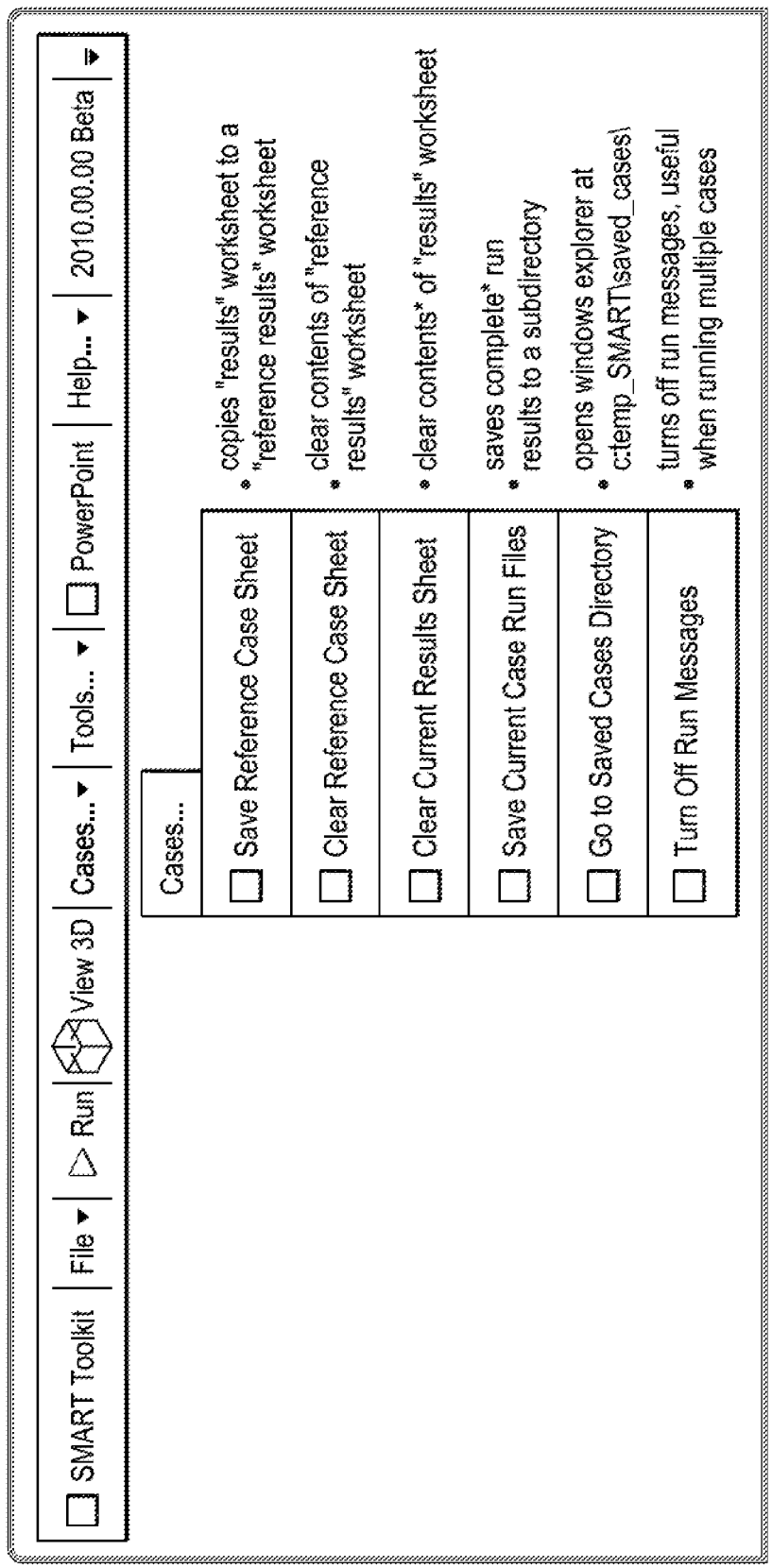
FIG. 1C. Toolbar showing practical modeling functions according to one embodiment of the presently disclosed system.

Finally, the toolkit can also include practical functions for working with cases, such as save, clear, and the like, as shown in FIG. 1C.

Figure 1D:
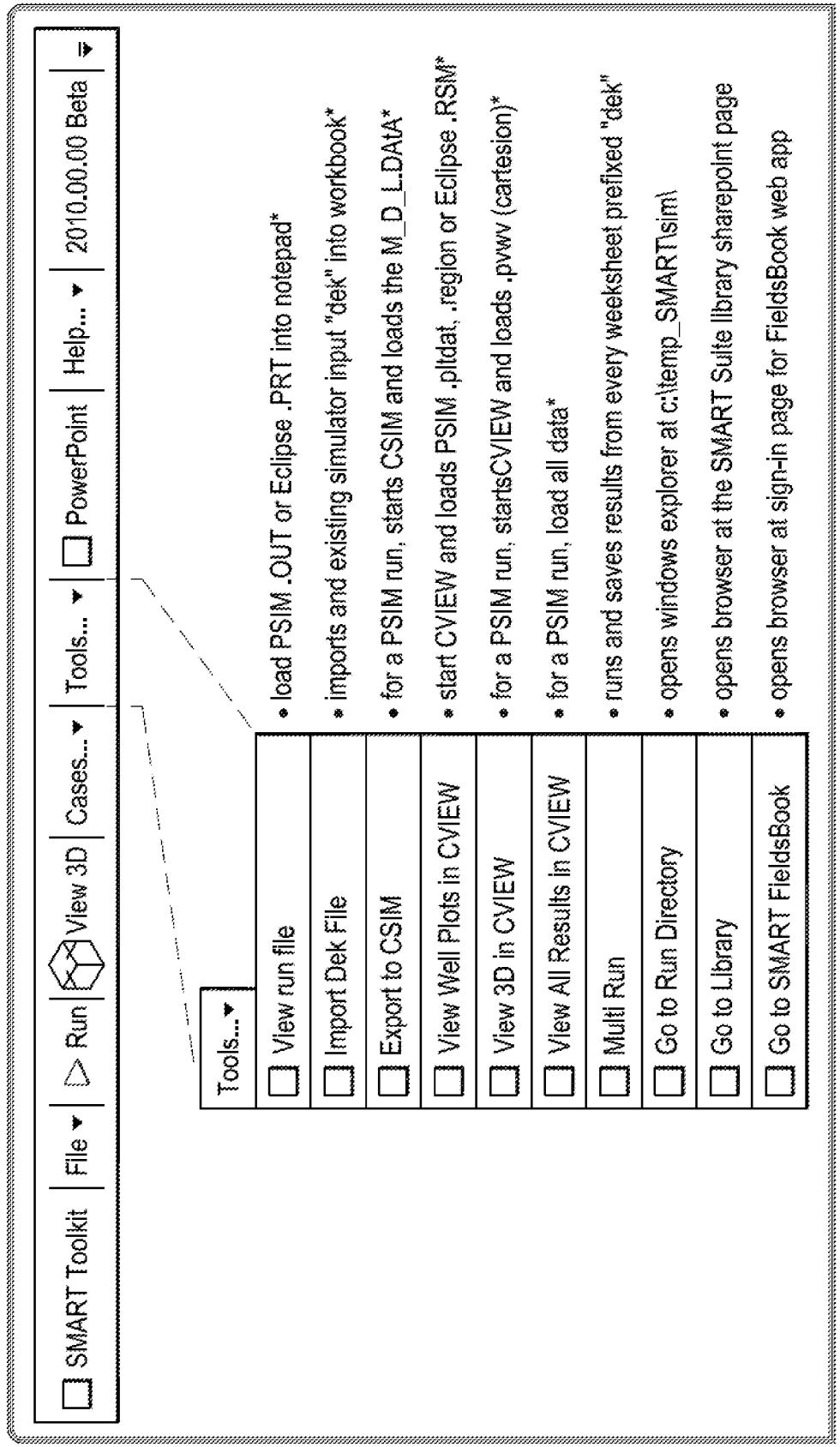
FIG. 1D. Toolbar showing useful modeling tools according to one embodiment of the presently disclosed system.

Each template and related toolkits are capable of interacting with many commercially available simulator programs such as PSIM (from ConocoPhillips), Eclipse (from Schlumberger), Crystal Ball (from Oracle), and FieldsBook (from RST Instruments). The user can select the simulator program or it can be automatically detected by the workflow. Once the simulator is determined, the system will transform the input data and correlations into a format that is required by the simulator and will submit the file for simulation. FIG. 1D displays a screenshot of some of the useful functions and tools for running these simulators from the toolkit.

Figure 2A:
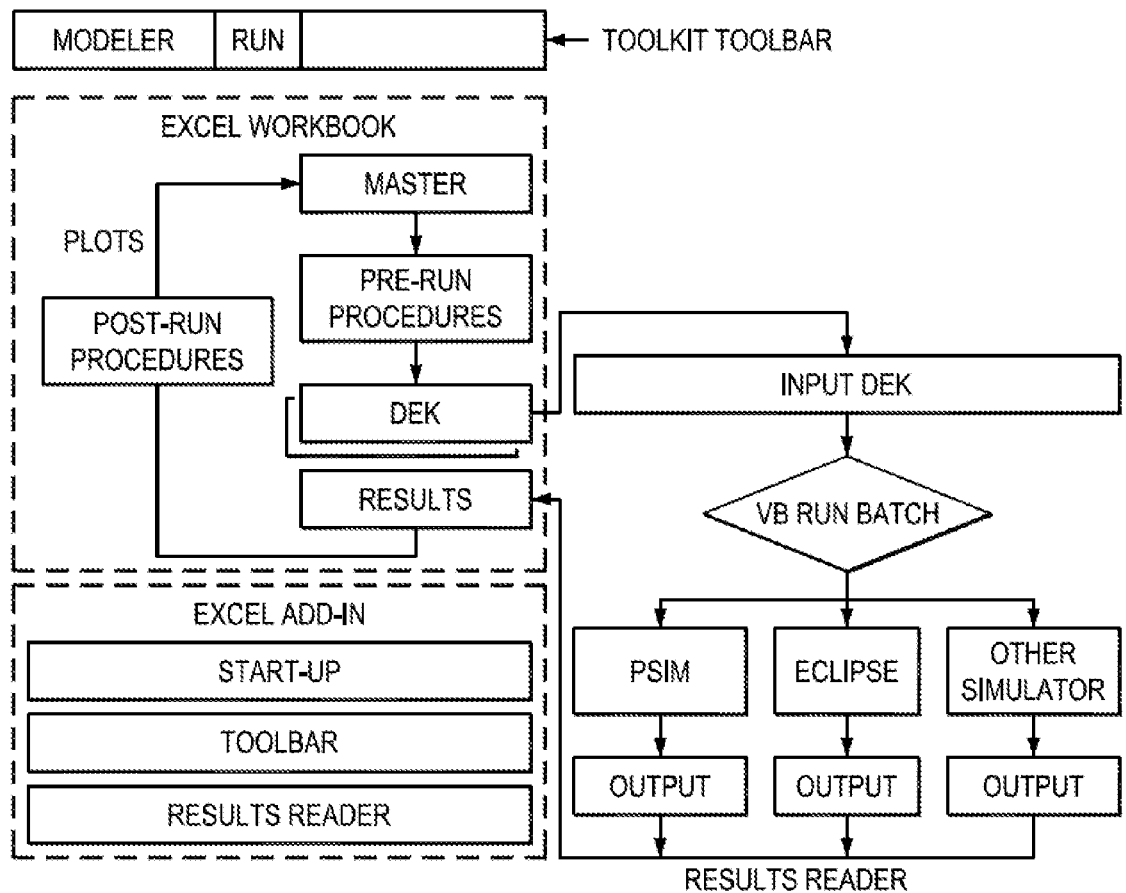
FIG. 2A. Operational flow chart for the embodiment in FIG. 1A-D.
Figure 2B:
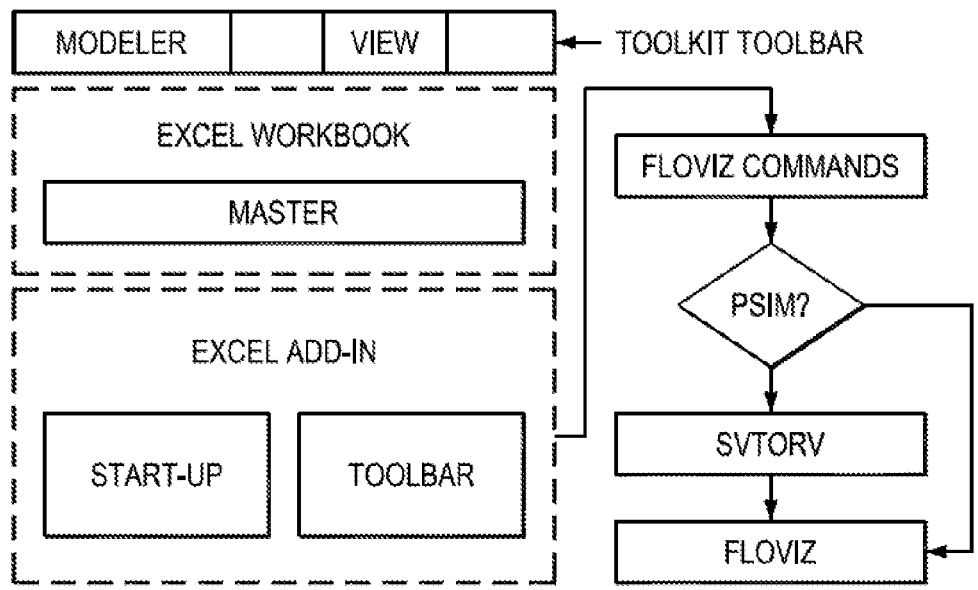
FIG. 2B. Operational flow chart for modeling a 3D view of a simulation that converts PSIM run results into Eclipse FloVIZ format.

Two exemplary operational flow charts of the system are shown in FIGS. 2A and 2B. FIG. 2A displays the procedure for the simulation "run" of a typical model. The "run" writes the simulator input file, runs the simulation, and reads the vector results. The Excel workbook has the master system with the templates. The pre-run procedures involve selecting utilities and inputting parameters into the chosen template(s). Once finished, the data is transformed to a format (dek) that is readable by the simulator. The system then sends the readable file to the simulator input application (input dek).

The simulation software, e.g. PSIM or Eclipse, then performs the simulation. Once finished, the system retrieves the simulation results and converts them into user friendly displays such as tables or charts for technical interpretation. The results are typically displayed in a separate spreadsheet within the workbook.

FIG. 2B displays a simplistic operational flow chart for viewing the results of a 3D simulation model after the steps performed in FIG. 2A. Here, the system is exemplified as using the FloVIZ module (Mentor Graphics) to view the 3D results. FloVIZ is a free results viewer for visualizing flow. The workbook is able to load successful run array results into the appropriate Eclipse FloVIZ format and is even capable of outputting PSIM results in the FloVIZ format. However, other systems could be used, such as ModelRisk Results Viewer, the Petrel Data and Results Viewer and the spreadsheet would only require modifications to the visual programming code.

Figure 2C:
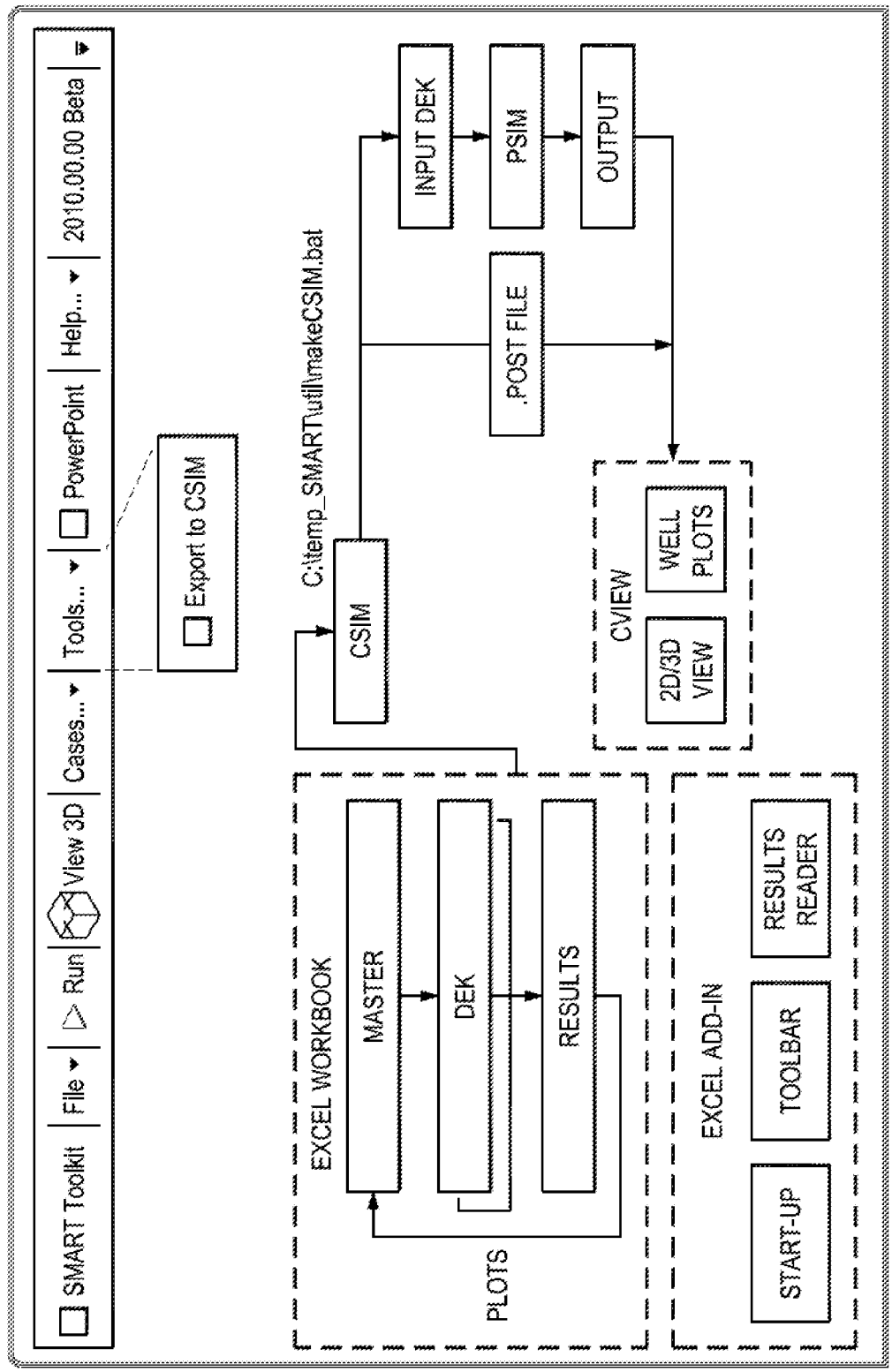
FIG. 2C. Operational flow chart for "Export to CSIM" in one embodiment of the described system.

FIG. 2C displays the simplistic operational flow chart when the "Export to CSIM" function is selected under the Tools menu on the toolbar. As seen, the toolkit allows for a full-feature PSIM model-builder and customization options. Such functionality is not currently available anywhere else.

The use of a spreadsheet program in the present system provides a unique scaling capability. Most models operate on the simulator input text file by parameterization. However, the present input file is created using Excel formulas, functions, and procedures. This allows the simulator to operate directly and dynamically through these arrangements. In some instances, additional customized utilizes can be added to the input files using the present workflow to increase detail. In others, only the bare amount of input is needed. Thus, this allows for scalability within the model from very little detail to high detailed modeling.

Further, most users are familiar with some type of spreadsheet applications, thus making this application inherently more beneficial for displaying simulation results than the reservoir simulation.

Additionally, the use of a spreadsheet application allows a user to add additional calculations for economic, uncertainty or other types of reports based on the simulation results. Thus, a user can centralize input, simulation results, and calculations that would traditionally be scattered across multiple different workbooks.

The spreadsheet can also be programmed to create a new Powerpoint (or other similar presentation software) presentation with the results. In some embodiments, the spreadsheet is programmed to add the results to the end of an open Powerpoint file. In other embodiments, the spreadsheet is capable of creating a new presentation with slides displaying the results of the analysis. In either embodiment, the newly created slides can include the results from an active worksheet or the results from the entire spreadsheet.

As proof of concept, the disclosed system was programmed into an Excel workbook and named the SMART (Scalable, Multidiscipline, Applied, Reservoir, Technology) modeler. To test its capabilities, the SMART modeler was used to evaluate various subsurface development projects for different types of target hydrocarbons. The system and methods of use are further described below in the following tests.

Test 1: Waterflooding

The workflow system, in the form of the SMART modeler, was applied to an oil reservoir waterflooding simulation for the Maureen Field in the UK sector of the North Sea. The simulation is a 3D model for 13,800 acres having a grid size of 25.times.25.times.3 wherein the results of the simulation contain a structure map and refined well placement.

Screenshots of the workflow interface are shown in FIG. 3-6. As seen in FIG. 3-5, the workflow utilizes the Excel template add-in to design a robust tool operation while also permitting high levels of customization in the template. The oil reservoir simulation theme or template, i.e. the technical analysis objective, has pre-programed characterization and development sections such as model architecture and grid, layer and rock properties and a customizable development options (FIG. 3A-B).

For instance, FIG. 3A-B shows that a user merely has to select model type (here, "3D model"), modeling method ("Layer Cake Model with Avg. Properties"), and input characteristics (area, oil-water contact, etc.) for the model architecture and grid. Same for the layers and rock properties window, where "layer cake model with average properties" was selected and the remaining features of the model as selected are autogenerated in the display window.

Figure 4A:
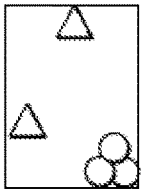
Figure 5A:
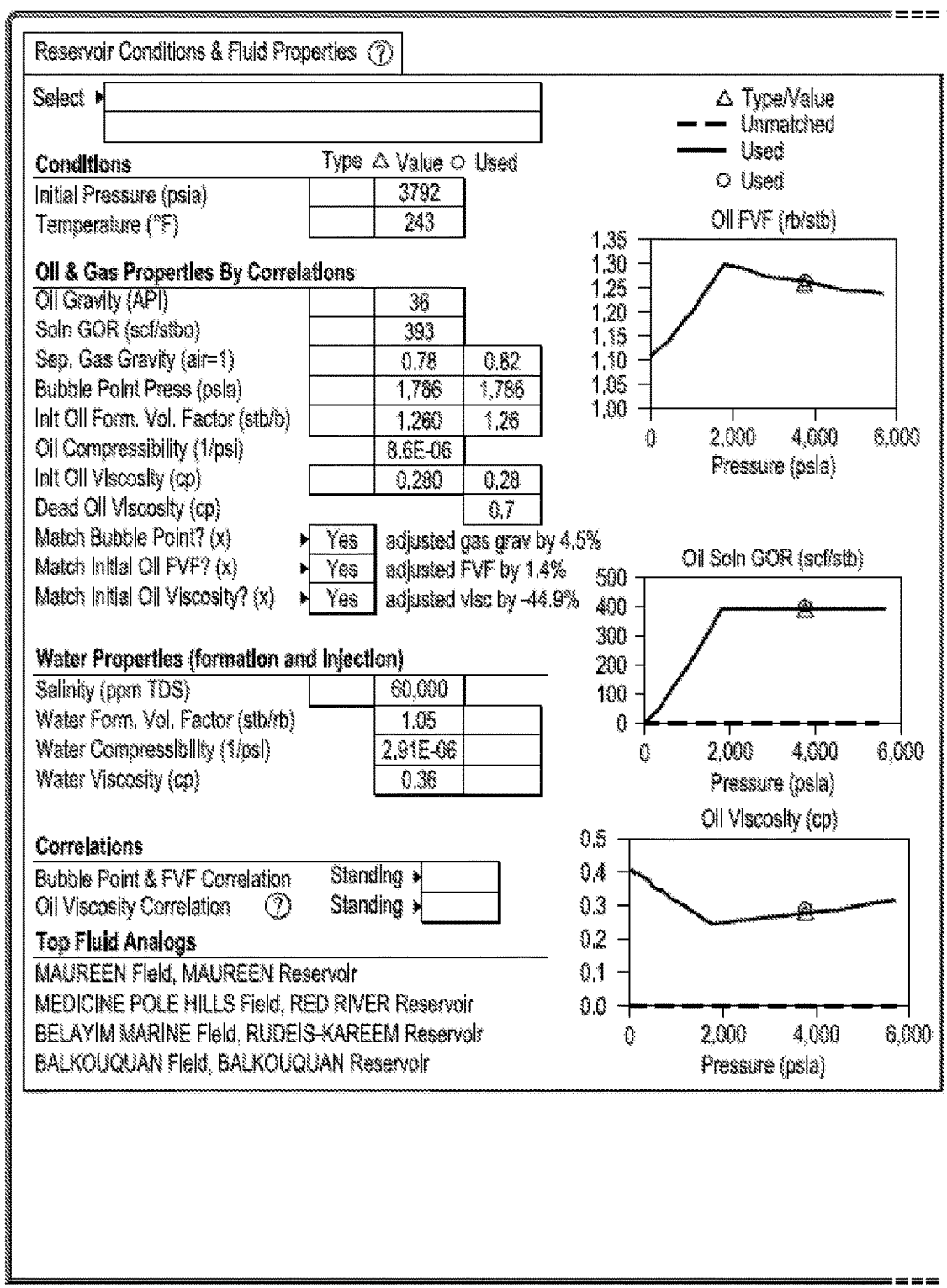
FIG. 5A-B. An Oil Reservoir Waterflood model using the SMART modeler showing the input screens for reservoir conditions and fluid properties and estimated oil recovery.
Figure 5B:
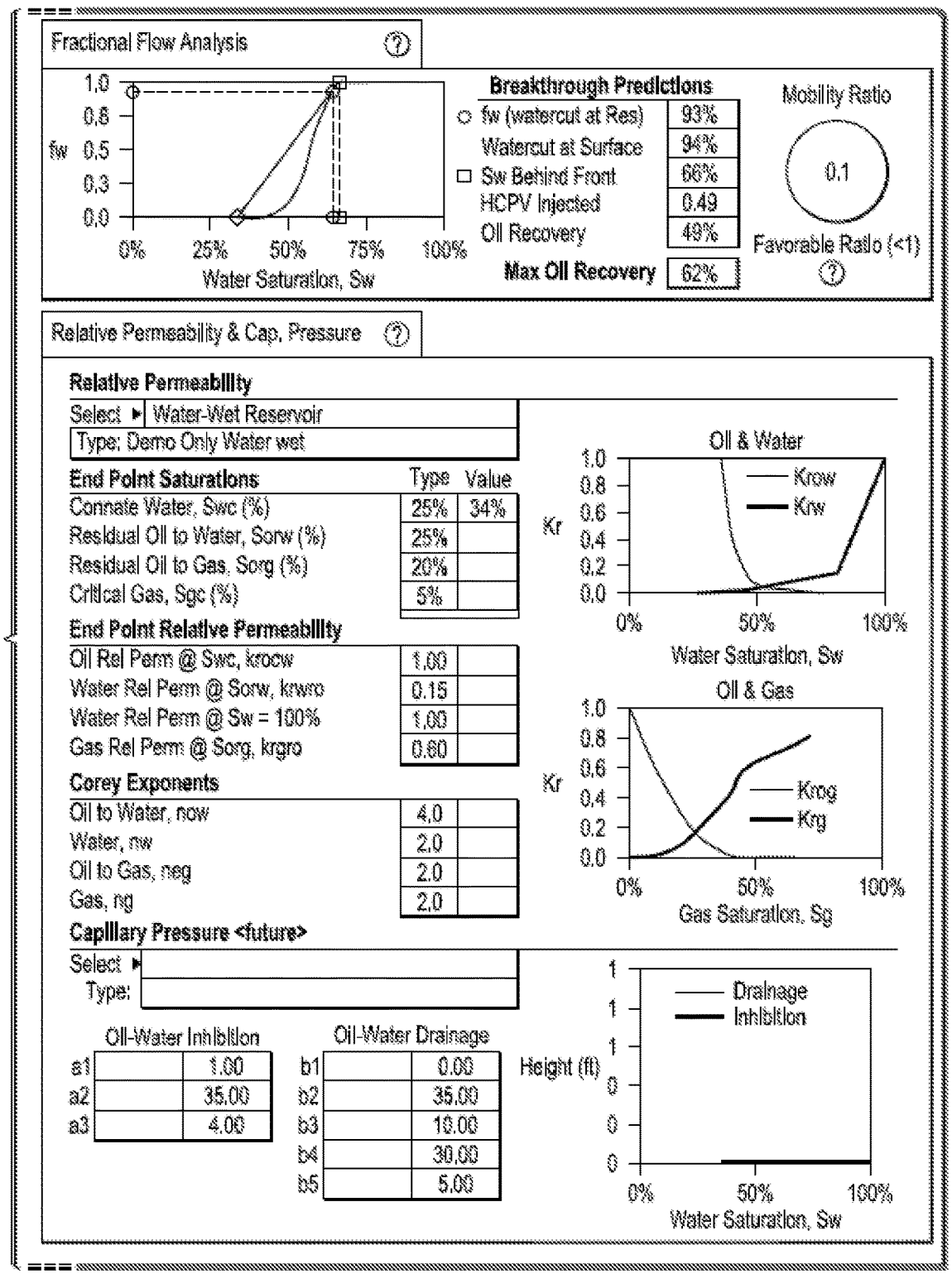

FIG. 4A-B displays a utility for choosing reservoir development options. For this particular simulation, the user is able to customize the development of the waterflood to match the type of injections for each well, well size, and/or target area of waterflood. FIG. 5A-B displays the input screens for fluid properties. The utility is able to perform intermediate calculations for e.g. oil compressibility using the information added by the user.

Once the user has inputted all the required data, the system performs all needed intermediate calculations and data extrapolation before converting this input data into a full model input table that is readable by the selected simulation program. The system then submits this file to the simulation program for modeling. Once completed, the system retrieves the simulation results. A screen shot of exemplary results are shown in FIG. 6A.

For a waterflood model, the system displayed the results in multiple easy to interpret charts inside an Excel worksheet. The estimated oil rate, water injection rate, average reservoir pressure, water cut, and gas oil ratio charts are a few examples of the results display for a simulation of a 15 year development period. As can be seen in the toolbar along the top of the screen, a user also has the option of generating a results summary, Powerpoint report, and economics and uncertainty analysis. An add-in tool controls each of these features, thus allowing for the visual basic object to be used on the results screen.

Figure 6A:
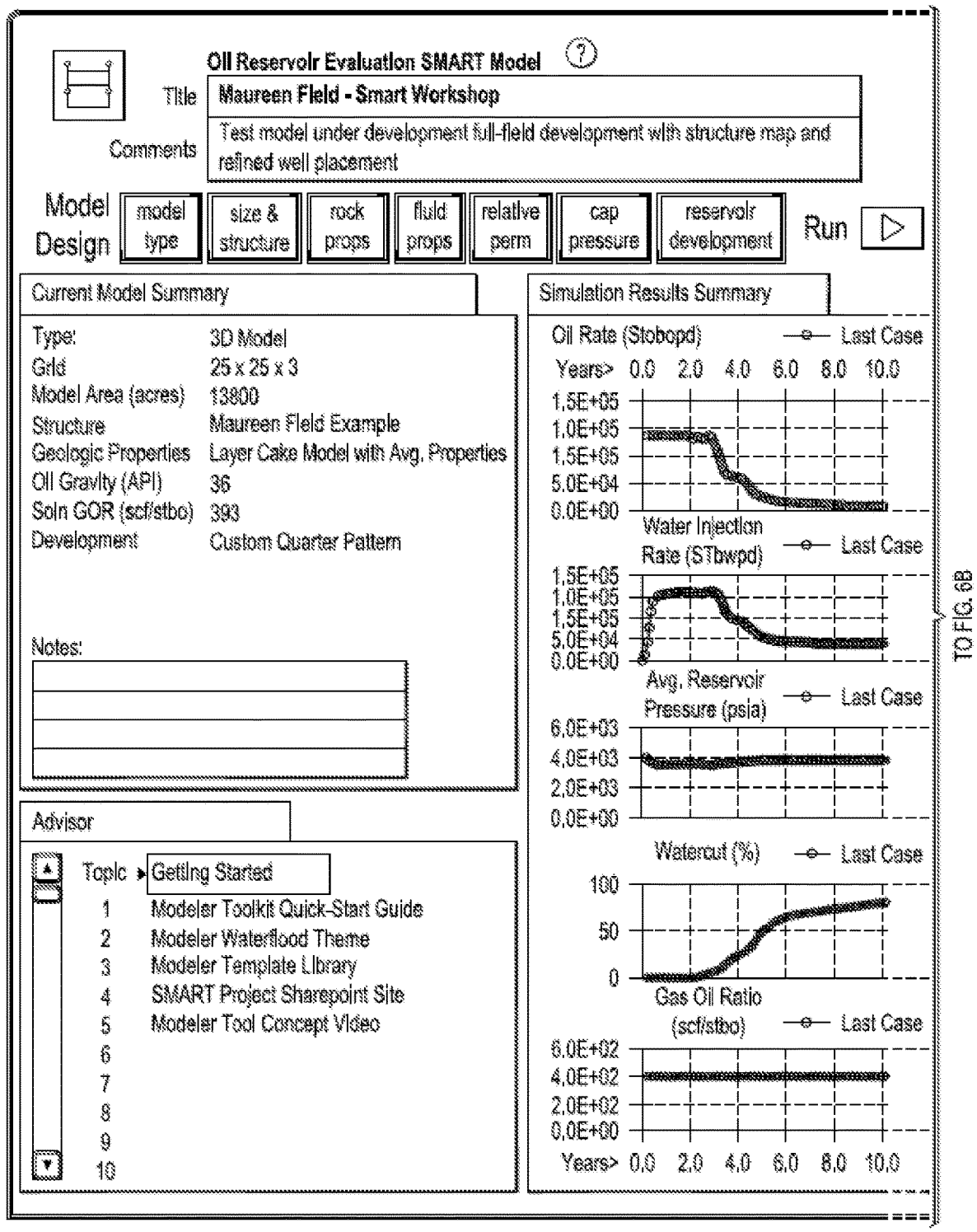
FIG. 6A. Screenshot of an interface for an Oil Reservoir Waterflood simulation using the SMART modeler showing the results summary screens post-simulation by a third-party simulator.

FIG. 6A also displays the outline of the workflow in the "Advisor" window and serves as a guide for the user. Quick links to the template library and concept video are available to allow a user to quickly add additional information for a new simulation.

Figure 6B:
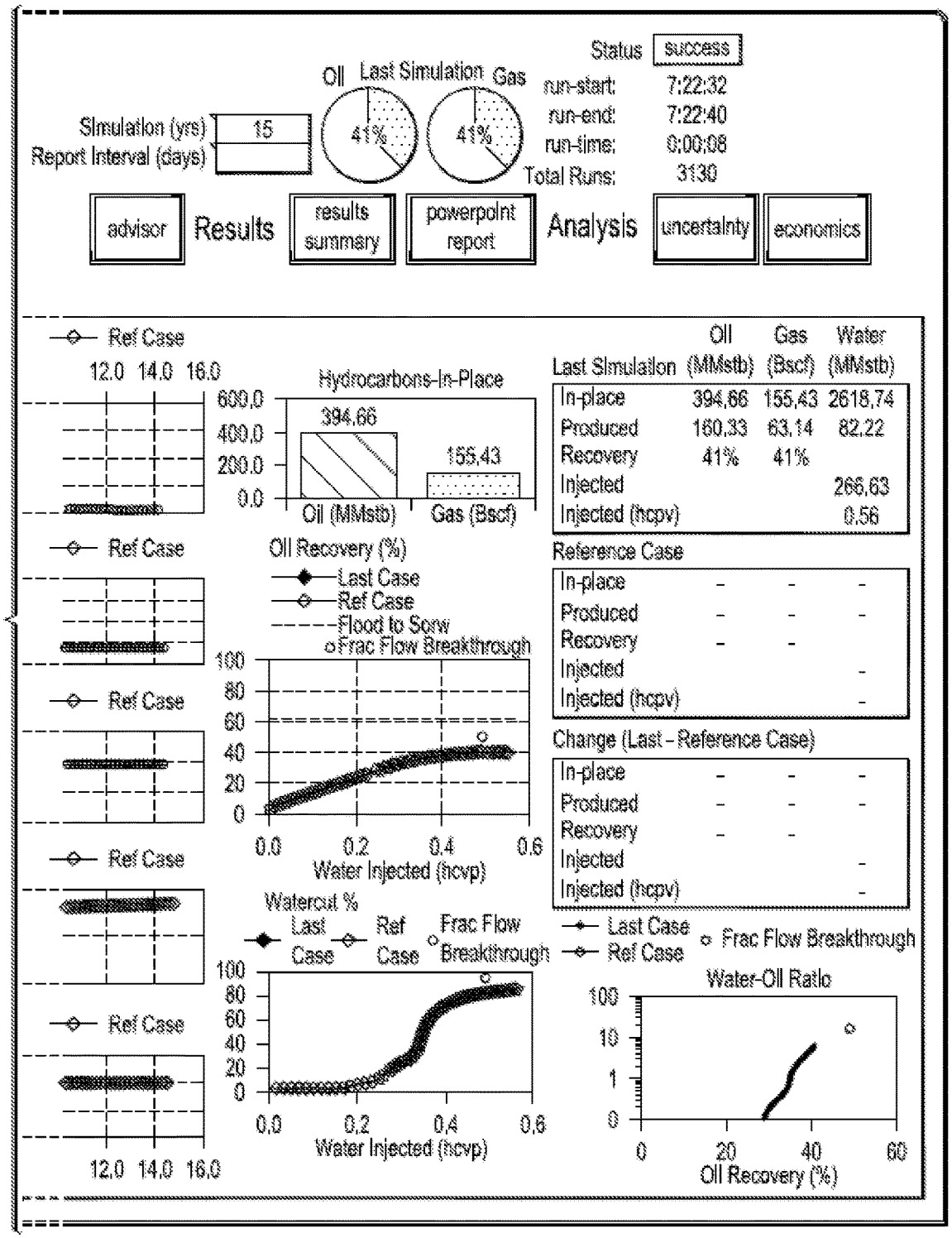
FIG. 6B-6C. display the creation of new presentation slide with results from FIG. 6A.
Figure 6C:
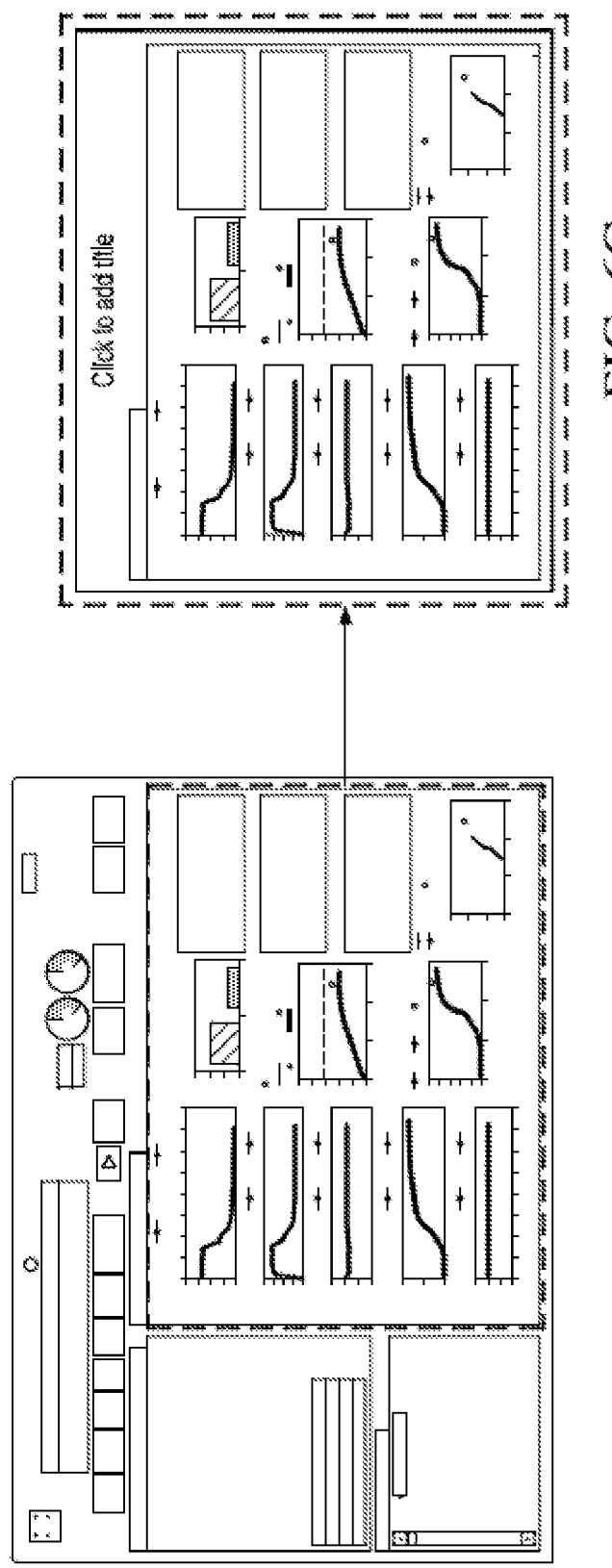
Figure 7B:
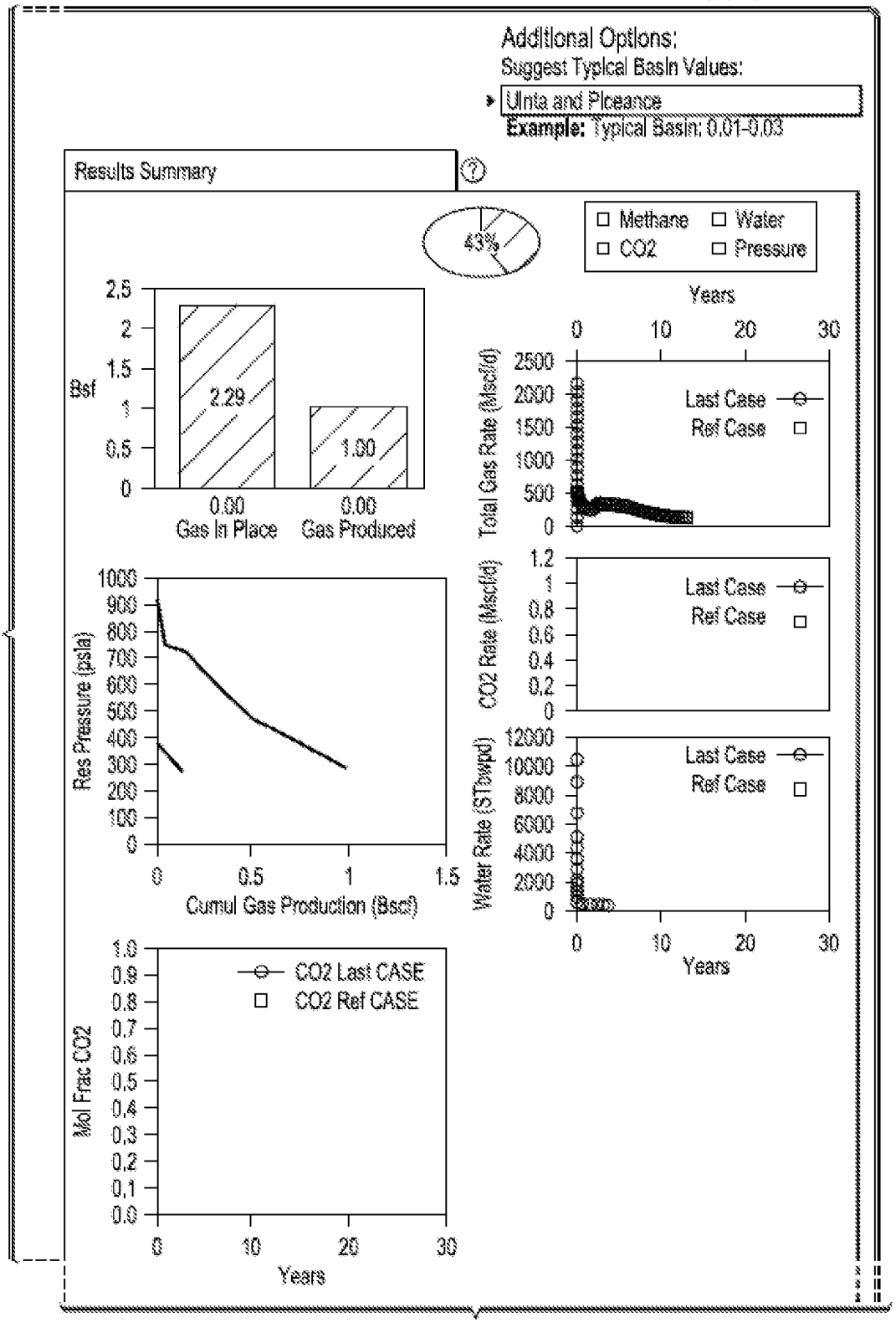
Figure 7C:
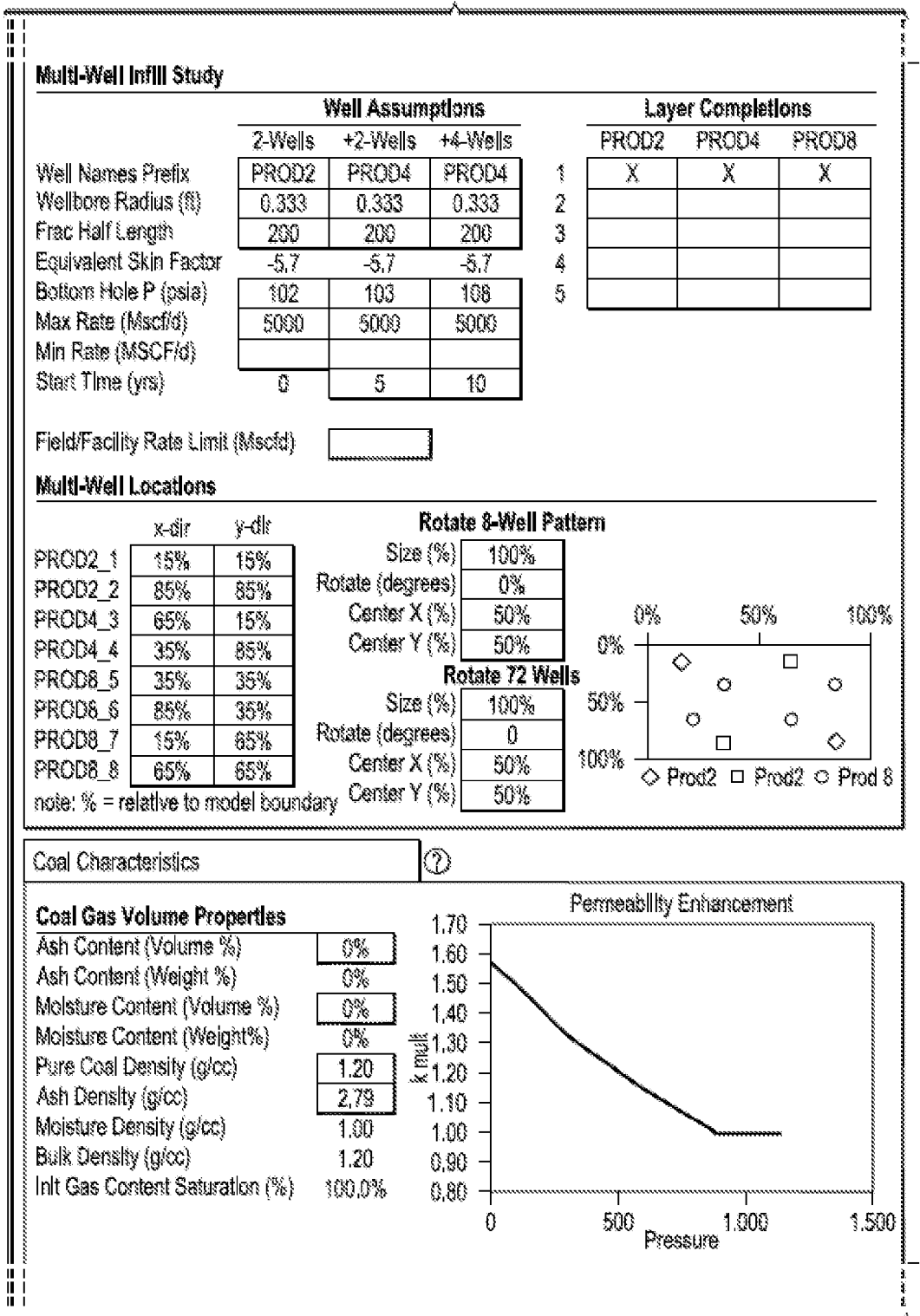
Figure 8C:
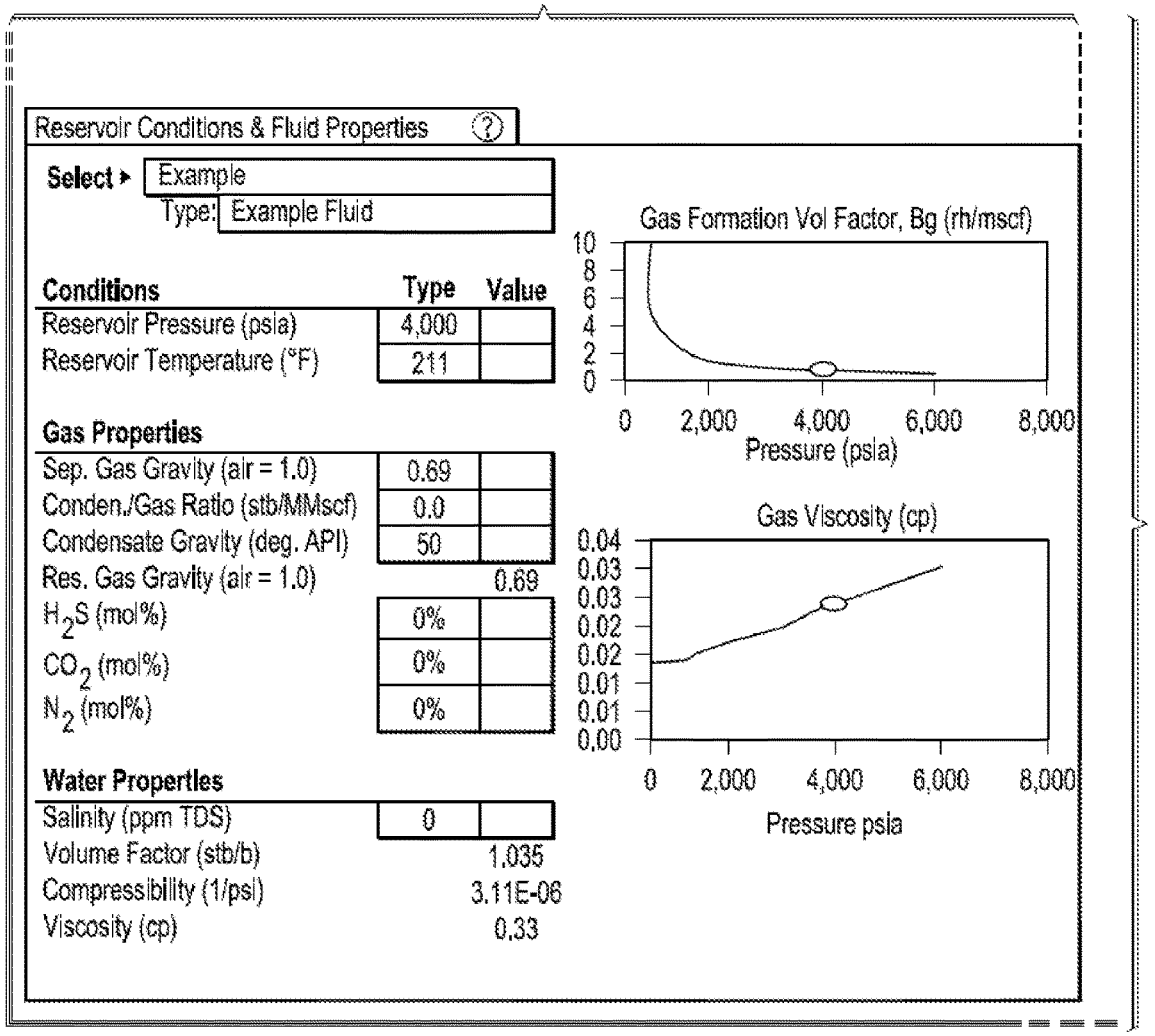
Figure 8D:
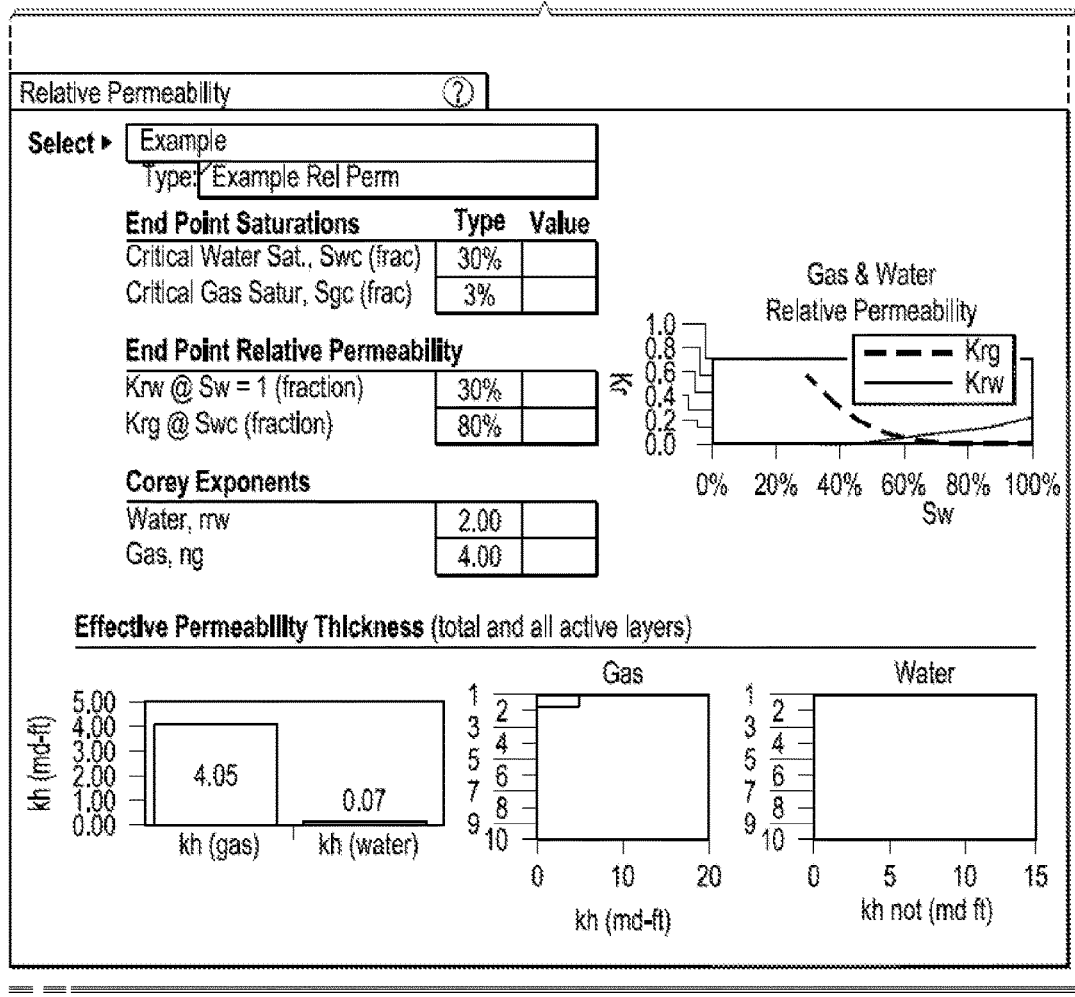

As discussed above, the toolkit is also capable of creating a new Powerpoint presentation or slide at the end of an active Powerpoint presentation with the results, as shown in FIG. 6B-6C.

Test 2: Coal Bed Methane

FIG. 7A-F display the evaluation results for a coal bed methane simulation for a reservoir in the Piceance Basin in northwestern Colorado, wherein the results are a combination of charts and tables. Both the input boxes and results summaries are on displayed in FIG. 7A-F. As previously seen in Test 1 for Waterflooding, the template for a coal bed methane objective provides guidance and results relevant to the simulation. Further, because of the guided input, the user only has to input the minimum amount of information. Again, the system then converts the input into a file readable by a simulation program and retrieves the results of the simulation when completed. The results can then be used to retrieve hydrocarbons from the reservoir.

Test 3: Tight Gas

A tight gas evaluation was performed on a test reservoir and the corresponding interface with results is shown in FIG. 8A-D. In this particular theme, a user chose one of four model options. Here, a "Vertical Well in Logarithmic Grid" was chosen to be evaluated for a 20-year duration. The simulator of choice was PSIM. From the user input of model area and top depth, the system calculated the model grid information, including the total active grid blocks.

The user can also include the properties of the formation by layer for up to 10 layers in this version, although more layers can be added to future versions of the spreadsheet tool.

Fluid Property Correlation

FIG. 9 displays a short list of some of the fluid property correlation functions currently available in the toolkit. However, others such as CO.sub.2 properties, Psuedo EOS for oil and gas condensates and the like are in beta testing for addition to the toolkit. Due to the use of Excel as the basis of the toolkit, any known fluid property correlation can be programmed in to the system.

The following references are incorporated by reference in their entirety.

SPE-57439 (1999) Sawyer et al. A simulation-based spreadsheet program for history matching and forecasting shale gas production.

US2010262900 Utilizing spreadsheet user interfaces with flowsheets of a CPI simulation system U.S. Pat. No. 8,577,652 Spreadsheet-based graphical user interface for dynamic system modeling and simulation

The invention claimed is:

1. A system for simulating a hydrocarbon-containing reservoir, comprising:
one or more processors;
a display; and
one or more memories storing a reservoir simulator program and a spreadsheet application, said spreadsheet application having:
a modeler library, wherein said modeler library contains one or more templates, wherein each template has a different technical analysis objective;
a toolkit within each template having at least one utility, wherein said utility has one or more cells for entering guided inputs and displaying autogenerated selections generated based on the guided inputs and parameters of said spreadsheet application;
a converter, wherein said converter transforms said guided inputs and autogenerated selections into a simulation data file, wherein said simulation data file has a format readable by said reservoir simulator program; and
a worksheet for displaying simulation results on said display, wherein said simulation results are received from said reservoir simulator program, and wherein said reservoir simulator program uses at least one of said simulation data file to generate said simulation results.

2. The simulation system of claim 1, wherein said reservoir simulator program is PSIM or Eclipse.

3. The simulation system of claim 1, wherein said spreadsheet application is Excel.

4. The simulation system of claim 1, wherein said technical analysis objective is waterflooding, tight gas, coalbed methane, slimtube, advanced grids, carbon dioxide flooding, carbon dioxide sequestration, well test design, production forecast roll-up, and/or exploration and field development simulations.

5. The simulation system of claim 1, wherein said reservoir inputs and parameters include grid area, model dimensions, PVT, relative permeability, porosity, layer characterization, geomodeling, and/or development options.

6. A simulation system comprising:
a computer having at least one processor and a storage medium, wherein said processor is configured to execute a computer program suite, said computer program suite being stored upon said storage medium, said computer program suite comprising a spreadsheet application and a reservoir simulation application, wherein the spreadsheet application and the reservoir simulation application are discrete, stand alone applications;
said spreadsheet application comprising a graphic user interface (GUI) for interacting with users, said graphical user interface comprising a plurality of templates, wherein each template has one or more utilities having a plurality of cells for inputting guided inputs for predetermined reservoir parameters and for displaying autogenerated selections generated based on said inputted guided inputs and said predetermined reservoir parameters, and wherein said graphical user interface further comprises an integration tool for transforming said inputted guided inputs and autogenerated selections into at least one data sheet that is readable by said reservoir simulation application, retrieving simulation results from said reservoir simulation application and displaying said results in a worksheet; and,
said reservoir simulation application comprising a computer program for simulating reservoir development using said at least one data sheet.

7. The simulation system of claim 6, wherein said integration tool further comprises a simulation control module and a programming interface, wherein the simulation control module interfaces with the spreadsheet application, and wherein the programming interface interfaces with the reservoir simulation application, wherein all data conveyed between the spreadsheet application is conveyed between the spreadsheet application and the simulation control module, between the simulation control module and the programming interface, and the programming interface and the reservoir simulation application.

8. The simulation system of claim 6, wherein said reservoir simulator application is PSIM or Eclipse.

9. The simulation system of claim 6, wherein said spreadsheet application is Excel.

10. A method of modeling an oil reservoir comprising,
entering one or more guided reservoir inputs and parameters into a programmable spreadsheet workbook,
automatically generating selections of a subset of the one or more guided reservoir inputs and parameters based on the entered one or more guided reservoir inputs and parameters of the programmable spreadsheet workbook, said spreadsheet workbook having:
  a modeler library, on said one or more processor, wherein said library contains one or more templates, wherein each template has a different technical analysis objective;
  a toolkit within each template having at least one utility, wherein said utility has one or more spaces for entering the guided reservoir inputs and parameters and for displaying the automatically generated selections;
  a converter, wherein said converter transforms said reservoir inputs and parameters into a simulation data file, wherein said simulation data file has a format readable by a reservoir simulator program;
  an integration tool for connecting said spreadsheet workbook with said reservoir simulation program; and
  a worksheet for displaying simulation results on said display;
converting reservoir inputs and parameters into a simulation data file with said converter;
submitting said simulation data file to said reservoir simulator program with said integration tool;
simulating a reservoir development to create a simulation result;
retrieving said simulation result with said integration tool; and
displaying said simulation results in said worksheet.

11. The method of claim 10, wherein said reservoir simulator program is PSIM or Eclipse.

12. The method of claim 10, wherein said spreadsheet workbook is programmed into Excel.

13. The method of claim 10, wherein said technical analysis objective is waterflooding, tight gas, coalbed methane, slimtube, advanced grids, carbon dioxide flooding, carbon dioxide sequestration, well test design, production forecast roll-up, and/or exploration and field development simulations.

14. The method of claim 10, wherein said reservoir inputs and parameters include grid area, model dimensions, PVT, relative permeability, layer characterization, geomodeling, and/or development options.

15. The method of claim 10, wherein said simulation results are displayed as a mixture of charts and tables.

16. A method of producing oil from a reservoir comprising,
entering one or more guided reservoir inputs and parameters into a programmable spreadsheet workbook,
automatically generating selections of a subset of the one or more guided reservoir inputs and parameters based on the entered one or more guided reservoir inputs and parameters of the programmable spreadsheet workbook, said spreadsheet workbook having:
  a modeler library, on said one or more processor, wherein said library contains one or more templates, wherein each template has a different technical analysis objective;
  a toolkit within each template having at least one utility, wherein said utility has one or more spaces for entering the guided reservoir inputs and parameters and for displaying the automatically generated selections;
  a converter, wherein said converter transforms said reservoir inputs and parameters into a simulation data file, wherein said simulation data file has a format readable by a reservoir simulator program;
  an integration tool for connecting said spreadsheet workbook with said reservoir simulation program; and
  a worksheet for displaying simulation results on said display;
converting reservoir inputs and parameters into a simulation data file with said converter;
submitting said simulation data file to said reservoir simulator program with said integration tool;
simulating a reservoir development to create a simulation result;
retrieving said simulation results result with said integration tool; and
displaying said simulation results in said worksheet;
repeating one or more of the above steps to optimize said simulation results, and
implementing said optimized simulation results in a reservoir to produce hydrocarbon.

17. The method of claim 16, wherein said reservoir simulator program is PSIM or Eclipse.

18. The method of claim 16, wherein said spreadsheet workbook is programmed into Excel.

19. The method of claim 16, wherein said one or more reservoir characteristics, reservoir development configuration, fluid injection properties and model parameters include grid area, model dimensions, PVT, relative permeability, layer characterization, geomodeling, number and placement of injection and production wells, length of simulation, and/or development options.

20. The method of claim 16, wherein said simulation results are displayed as a mixture of charts and tables.

21. The method of claim 20, wherein said charts include oil rate, water injection rate, average reservoir pressure, watercut, and/or gas-oil ratio.

* * * * *